US012554285B2

(12) United States Patent
Hemiller

(10) Patent No.: US 12,554,285 B2
(45) Date of Patent: Feb. 17, 2026

(54) ADJUSTABLE MOUNTING FRAME FOR AN ELECTRONIC DISPLAY

(71) Applicant: Daktronics, Inc., Brookings, SD (US)

(72) Inventor: Katelyn Hemiller, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 36 days.

(21) Appl. No.: 18/328,644

(22) Filed: Jun. 2, 2023

(65) Prior Publication Data

US 2023/0393612 A1 Dec. 7, 2023

Related U.S. Application Data

(60) Provisional application No. 63/348,810, filed on Jun. 3, 2022.

(51) Int. Cl.
*G06F 1/16* (2006.01)
*H05K 5/02* (2006.01)

(52) U.S. Cl.
CPC ......... *G06F 1/1601* (2013.01); *H05K 5/0204* (2013.01); *H05K 5/0217* (2013.01)

(58) Field of Classification Search
CPC ............ G06F 3/1446; G09G 2300/026; G09F 9/3026; G09F 9/33; G09F 19/22; G09F 19/226; G09F 13/22; G09F 13/0454; G09F 2007/1843; G02F 1/13336
See application file for complete search history.

(56) References Cited

U.S. PATENT DOCUMENTS

| | | | |
|---|---|---|---|
| 5,995,179 A | 11/1999 | Tamura et al. | |
| 2008/0141572 A1 | 6/2008 | Tomich et al. | |
| 2020/0205305 A1 | 6/2020 | Kim | |
| 2021/0343197 A1* | 11/2021 | Timmins | G09F 9/3026 |

FOREIGN PATENT DOCUMENTS

| | | |
|---|---|---|
| CN | 202056484 | 11/2011 |
| EP | 0997865 | 5/2000 |
| KR | 20140067771 | 6/2014 |
| WO | 2023235874 | 12/2023 |

OTHER PUBLICATIONS

"International Application Serial No. PCT US2023 067878, International Search Report mailed Oct. 10, 2023", 5 pgs.
"International Application Serial No. PCT US2023 067878, Written Opinion mailed Oct. 10, 2023", 5 pgs.
"International Application Serial No. PCT US2023 067878, International Preliminary Report on Patentability mailed Dec. 12, 2024", 7 pgs.

* cited by examiner

*Primary Examiner* — Sanjiv D. Patel
(74) *Attorney, Agent, or Firm* — Schwegman Lundberg & Woessner, P.A.

(57) ABSTRACT

A support system for an electronic display comprises one or more support frames configured to be mounted to a planar or substantially planar building structure, wherein each support frame comprises a mounting face configured for mounting one or more display modules to the one or more support frames to form a display surface, and at least one adjustment mechanism corresponding to each of the one or more support frames for adjusting a position or an alignment, or both, of the support frame relative to the planar or substantially planar building structure.

21 Claims, 15 Drawing Sheets

ADJUSTABLE MOUNTING FRAME FOR AN ELECTRONIC DISPLAY

CROSS-REFERENCE TO RELATED APPLICATION

This application claims priority under 35 U.S.C. § 119(e) to U.S. Provisional Application Ser. No. 63/348,810, filed on Jun. 3, 2022, entitled "ADJUSTABLE MOUNTING FRAME FOR. AN ELECTRONIC DISPLAY," the disclosure of which is incorporated herein by reference in its entirety.

BACKGROUND

Displays comprising a plurality of light-emitting elements, or display modules, are used for the display of information. In some applications, such as digital billboards or scoreboards, individual display modules can be connected together and operated collectively to form a larger display. In such an arrangement, the individual display modules can be mounted onto the face or faces of one or more underlying support structures, which can be referred to as a "support frame" or simply as a "frame."

BRIEF DESCRIPTION OF THE DRAWINGS

The drawings illustrate generally, by way of example, but not by way of limitation, various embodiments discussed in the present document.

DETAILED DESCRIPTION

Figure 1:
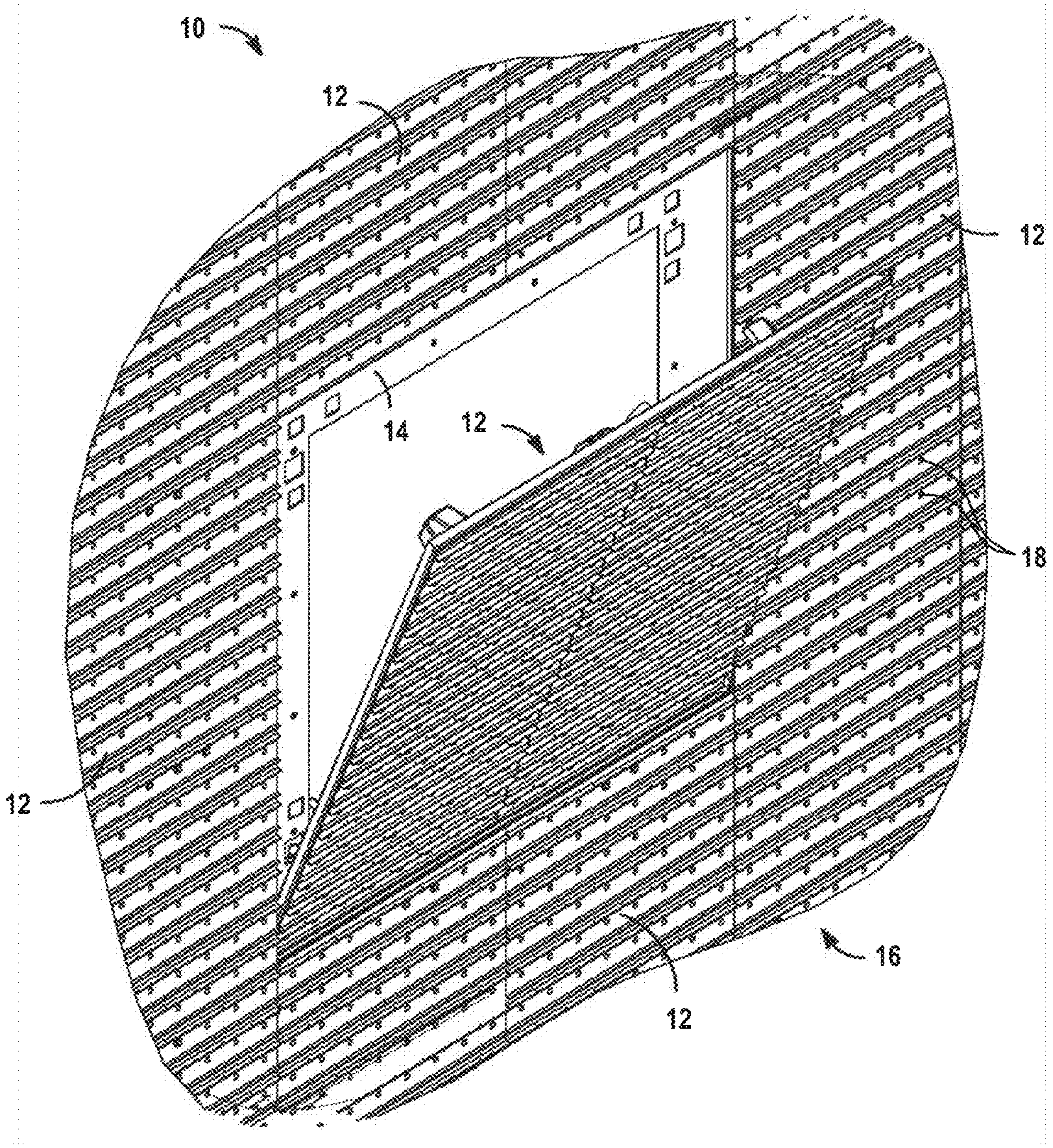
FIG. 1 is a partial perspective view of an example electronic display comprising a plurality of individual display modules that are operated in a cooperative manner to display information on the light-emitting display.

The following detailed description includes references to the accompanying drawings, which form a part of the detailed description. The drawings show, by way of illustration, examples support frames for supporting display modules in an electronic display specific embodiments in which the invention may be practiced. These examples are described in enough detail to enable those skilled in the art to practice the invention. The example embodiments may be combined, other embodiments may be utilized, or structural, and logical changes may be made without departing from the scope of the present invention. While the disclosed subject matter will be described in conjunction with the enumerated claims, it will be understood that the exemplified subject matter is not intended to limit the claims to the disclosed subject matter. The following detailed description is, therefore, not to be taken in a limiting sense, and the scope of the present invention is defined by the appended claims and their equivalents.

References in the specification to "one embodiment", "an embodiment," "an example embodiment," "an example," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1 to about 5" should be interpreted to include not only the explicitly recited values of about 0.1 to about 5, but also the individual values within that range (e.g., about 1, about 2, about 3, and about 4) and sub-ranges (e.g., about 0.1 to about 0.5, about 1.1 to about 2.2, or about 3.3 to about 4.4) within the indicated range. The statement "about X to Y" has the same meaning as "about X to about Y,"" unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; and G; E and F; E and G: F and G; D, E, and F; D, E, and G; D, F, and G; E, F, and G; or D, E, F, and G." A comma can be used as a delimiter or digit group separator to the left or right of a decimal mark; for example, "0.000,1" is equivalent to "0.0001."

In the methods described herein, the steps can be carried out in any order without departing from the principles of the invention, except when a temporal or operational sequence is explicitly recited. Furthermore, specified steps can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and F (including with one or more steps being performed concurrent with step A or Step E), and that the sequence still falls within the literal scope of the claimed process. A given step or sub-set of steps can also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The term "about" as used herein can allow for a degree of variability in a value or range, for example, within 10%, within 5%, within 1%, within 0.5%, within 0.1%, within 0.05%, within 0.01%, within 0.005%, or within 0.001% of a stated value or of a stated limit of a range, and includes the exact stated value or range.

The term "substantially" as used herein refers to a majority of, or mostly, such as at least about 50%, 60%, 70%, 80%, 90%, 95%, 96%, 97%, 98%, 99%, 99.5%, 99.9%, 99.99%, or at least about 99.999% or more, or 100%.

In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

FIG. 1 shows an example of an electronic information display 10 (also referred to as "the electronic display 10" or simply the display 10") that is configured to display one or more of video, graphical, or textual information. The display 10 includes one or more individual display modules 12 mounted to one or more supports, such as one or more support frames 14 (also referred to herein simply as "frame 14" for brevity). In an example, one or both of each display module 12 or the frame 14 includes a mounting structure or apparatus at one or more locations relative each display module 12, such as one or more fasteners or latches.

In examples wherein the display 10 is formed from a plurality of the display modules 12, the plurality of display modules 12 can be operated together so that the overall display 10 appears as a single, larger display. FIG. 1 shows one of the display modules 12 being in a pivoted or tilted position relative to the frame 14, which can occur when that display module 12 is in the process of being mounted to, or dismounted from, the frame 14. However, the display 10 of the present disclosure is not limited to a setup where the display modules 12 are pivoted or tilted during installation onto or removal from the frame 14. In some examples, each display module 12 can be placed onto the frame 14 (during installation) or pulled off of the frame 14 (during removal) in a "straight on" orientation, e.g., with the plane of the display module 12 being parallel or substantially parallel with the plane of the frame 14 during at least the last portion of display module position during installation and during at least the first portion of display module removal during uninstallation. The other display modules 12 in the display 10 of FIG. 1 have already been mounted to the frame 14.

The display 10 can include a display surface 16 configured to display the video, graphical, or textual information from the display 10. As will be appreciated by those having skill in the art, the overall display surface 16 of the display 16 is formed from the front faces of the plurality of display modules 12. A plurality of light-emitting elements 18 is mounted to the display surface 16. For example, the light-emitting elements 18 can be mounted to one or more module support structures on each of the display modules 12, such as one or more of a circuit board, potting, or a module frame of a corresponding display module 12. The light-emitting elements 18 are operated together to display the video, graphical, or textual information on the display 10.

The light-emitting elements 18 can be any type of light-emitting technology known or yet to be discovered for the emission of light from a small area (e.g., from a pixel area), particularly for light-emitting technology that is or can be used display of visual information, such as video, graphical, or textual information. At the time of filing of the present application, light-emitting diodes (LEDs) are one of the most common light-emitting technologies in use for video or graphical displays of the type described herein. As such, for the sake of brevity, the remainder of the present disclosure will refer to light-emitting elements that can be used in a display (including the light-emitting elements 18 shown in FIGS. 1 and 2) will be referred to as LEDs 18. Those of skill in the art will appreciate, however, that any time the present disclosure uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

Figure 2:
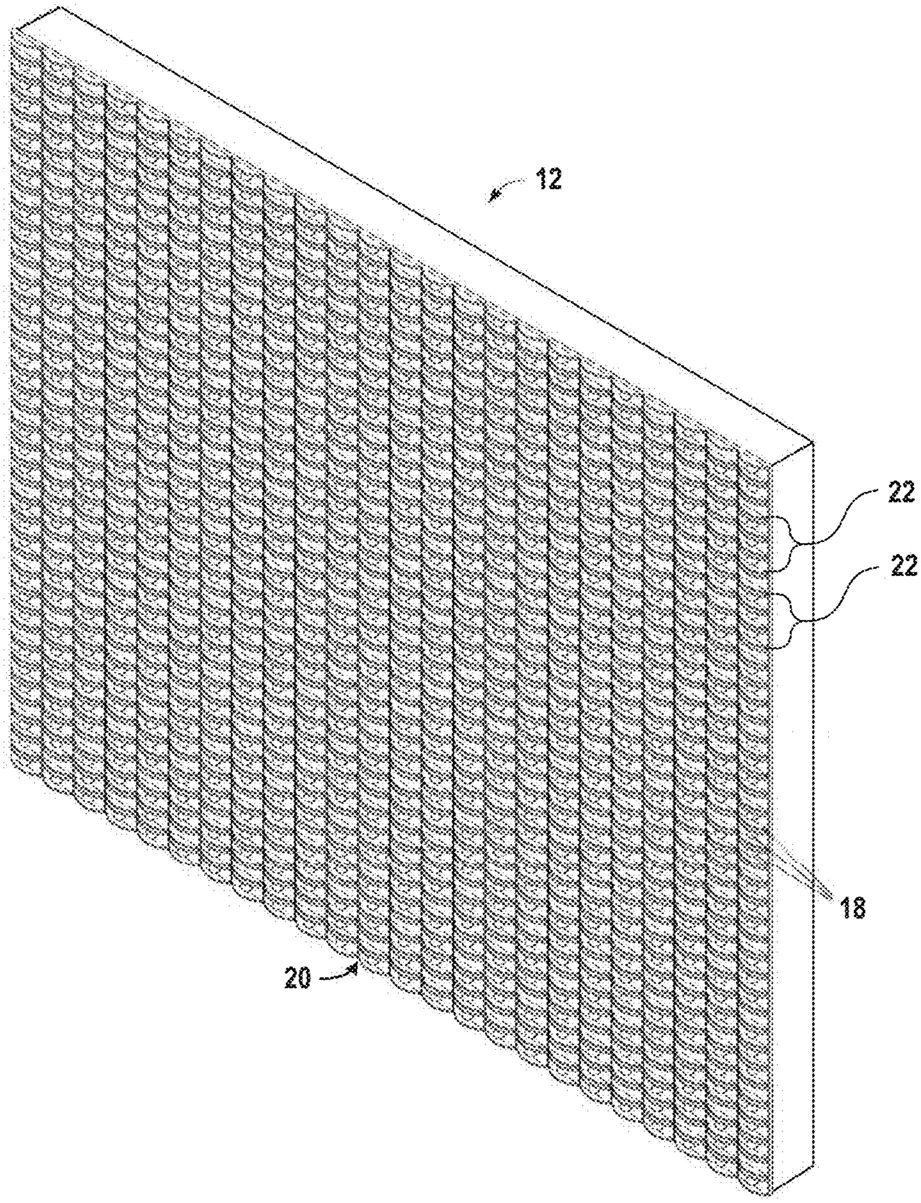
FIG. 2 is a perspective view of an example display module, which can be used as one of the individual display modules in the example electronic display of FIG. 1.
Figure 3:
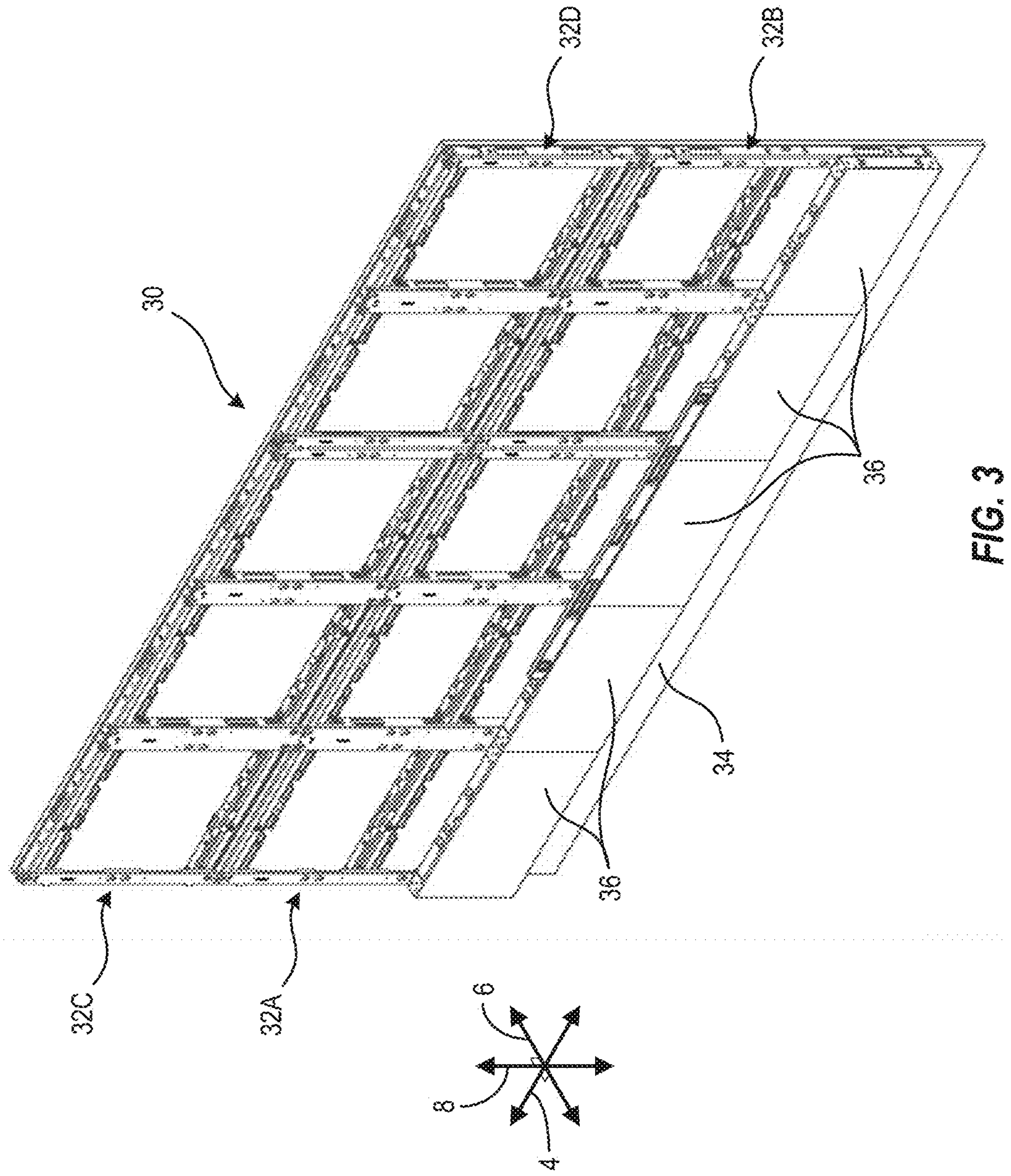
FIG. 3 is a perspective view of an example support substructure onto which can be mounted a plurality of display modules to form an electronic display mounted to a generally planar building surface.

FIG. 2 is a perspective view of an example display module 12 that can be used in the display 10 of FIG. 1. The display module 12 includes a front face 20 configured to provide for a display of video, graphical, or textual content. A plurality of the LEDs 18 is mounted to the front face 20 by being mounted onto a module support structure, such as an electronics circuit board or a module frame. The LEDs 18 can be operated in such a way that the display module 12 will display a portion of the video, graphical, or textual information to be shown on the display 10. The front face 20 of the display module 12 is aligned and oriented relative to front faces 20 of one or more adjacently-positioned display modules 12 so that the front faces 20 of all the display modules 12 combine and cooperatively form the overall display surface 16 of the full display 10 (shown in FIG. 1). The plurality of display modules 12 are operated together in such a way as to display the video, graphical, or textual information in a cohesive manner so that the entire display 10 appears to a viewer as a single display that is larger than the individual display modules 12.

In an example, the LEDs 18 are arranged into an array of pixels 22. Each pixel 22 includes one or more LEDs 18 grouped together in close proximity. The proximity of the pixels 22 allows the display 10 to be operated in such a way that they will appear to a viewer of the display 10 to form recognizable shapes, such as letters or numbers to display textual information or recognizable shapes to display video, graphical, or textual information. In some examples, the plurality of LEDs 18 includes a plurality of different-colored LEDs 18 such that different-colored LEDs 18 of each pixel 22 can be cooperatively operated to display what appears to be a spectrum of different colors for the viewer of the display 10. In an example, each pixel 22 includes three or more differently colored LEDs A common combination of LEDs that is used to form a color electronic display is the so-called "RGB" configuration, with each pixel 22 including at least one red LED ("R"), at least one green LED ("U"), and at least one blue LED ("B"). In the RGB configuration of the pixels 22, the red, green, and blue LEDs of each pixel 22 cooperate to provide essentially the entire color spectrum that is visible to humans based on whether one, two, or all three of the colors in a pixel 22 are lit, and at what intensities. The display 10 can also provide a black or empty looking surface over a portion of the display 10, when desired, by deactivating or turning off the LEDs in a designated area of pixels 22.

In some examples, the LEDs 18 of each pixel 22 can be arranged in a specified shape that is repeated for all of the pixels 22 in the array. In the example shown in FIG. 2, each pixel 22 includes a plurality of LEDs 18 arranged in a linear or substantially linear pixel shape comprising three LEDs 18 (e.g., which could be the red, green, and blue colored LEDs 18, as discussed above) that are aligned or substantially aligned in a common line, such as in the vertically aligned pixel shape of the pixels 22 shown in FIG. 2. Those of skill in the art will appreciate that pixel shapes other than a vertical or substantially vertical pixel 22 can be used, including, but not limited to: a linear or substantially linear pixel oriented in a direction other than vertical (e.g., a horizontal or substantially horizontal pixel shape or a diagonal linear pixel shape), or geometrical pixel shapes with one or more LEDs at each vertex of a specified geometrical shape, such as a triangular pixel 22 with each LED being positioned at the vertex of a triangle. Other pixel shapes can be contemplated, such as a quadrilateral pixel formed from four or more LEDs, a pentagonal pixel formed from five or more LEDs, and so on.

In an example, the pixels 22 are arranged in an array with a specified pattern. For example, the pixels 22 can be arranged in a specified array, such as a grid array. The display 10 can be controlled, for example with control software and/or one or more hardware controllers, so that visual information, e.g., video, graphical, or textual information, is broken down into coordinates. Each coordinate can correspond to a specific pixel location within the overall display 10, such as a specific row and a specific column, and the control software and/or the one or more hardware controllers can operate each pixel according to a program that specifies a condition for each coordinate within the display 10 and controls each of the pixels 22 so that it will appear to emit light that meets the condition specified. For example, if the display 10 is displaying a series of textual messages, the control software and/or the one or more hardware controllers can be fed the data corresponding to the series of textual messages, and the control software and/or the one or more hardware controllers can break the text of the messages down into conditions for each pixel 22, such as: the specified coordinates of the particular pixel 22; the time for the particular conditions of the particular pixel 22; whether the particular pixel 22 is to be lit at that time; the color that the particular pixel 22 is to display at that time (if the display 10 is a multi-colored display); and the intensity of the particular pixel 22 at that time. The control software and/or the one or more hardware controllers can also convert the information regarding color and intensity into specific operating parameters for each LED 18 in a particular pixel 22, such as the power that will be supplied to the red LED, the green LED, and the blue LED in an RGB pixel 22, and for how long in order to achieve the specified color and intensity at the specified time. The control software and/or the one or more hardware controllers can then send control signals to the pixels 22 or to individual LEDs 18 that can operate the pixels 22 according to the specified series of textual messages. Although a grid or grid-like array of LED pixels 22, as summarized above, is common, the display 10 described herein can use other arrangements of the LEDs or other systems for addressing the LEDs can be used without varying from the scope of the present invention.

Modular electronic displays like the display 10 of FIG. 1 are mounted to many different building structures or other support structures in order to create the electronic display. In some examples, the support chassis (such as the support frame 14 in the display 10 of FIG. 1) is mounted directly to a generally planar building surface, such as a wall, a ceiling, or a floor. Mounting an electronic display to a generally planar surface, and in particular to a wall or ceiling, can be difficult because it is challenging for an installer to ensure that the frame 14 is properly aligned with respect to the generally planar surface in order to further ensure that the display modules that are mounted to the frame 14 (such as the display modules 12) are properly aligned with respect to each other (e.g., so that the display modules 12 are level and so that the pixels 22 of one display module 12 are aligned relative to the corresponding pixels 22 on adjacent display modules 12 so that there is little to no distortion in the intended image, text, or video that is to be shown on the display 10).

Alignment of the display modules 12 can be particularly challenging when the supporting structure of the display 10 includes more than one frame 14, such as a plurality of frames 14 that are mounted to the generally planar surface so that the frames 14 form a larger overall support structure onto which are mounted the display modules 12 that will form the display 10. In such a configuration, it can be very challenging to ensure: (a) that each of the frames 14 that will form the overall support structure is properly aligned with respect to the generally planar support structure, e.g., so that all of the frames 14 are level and/or plumb; and (b) to ensure that all of the frames 14 are properly aligned with respect to each other, e.g., so that the mounting structures of the frames 14 onto which the display modules 12 will be mounted are aligned in the same plane or substantially in the same plane so that when the display modules 12 are mounted to the frames 14, the overall display surface 16 (which is made up of the individual front faces 20 of the display modules 12) will be planar or substantially planar so that the overall appearance of the image, text, or video being shown on the display 10 will be uniform and undistorted.

These challenges can be exacerbated by the face that building surfaces that are intended to be planar or level are not always fully planar or level. For example, walls can be non-planar due to imprecise construction or from manufacturing inconsistency of the building materials that form the wall (e.g., slight variation in thickness of drywall or support studs). In cases where the display 10 is being mounted to a building surface that is formed from a friable material, such as drywall or stucco, it may also be necessary to attach the support frame 14 or frames 14 to the underlying support structure (e.g., support studs or joists) so that the weight of the frames 14 and the display modules 12 does not break apart the friable material. It can also be difficult for an installer to locate the underlying support structures (which are typically regularly spaced apart, as is the case with studs or joists) and to ensure that the frame 14 or frames 14 are fastened to the underlying support structures while also trying to maintain the desired alignment of the frame 14 or frames 14 (e.g., to make sure that the frames H are level and aligned with respect to one another).

Presently, installing a display 10 to a generally planar building surface, such as a wall, has required some level of ad hoc improvisation for an installer. For example, the installer may have to first locate the support studs and then position a frame 14 on the building surface and use hardware mounting holes on the frame 14 as guides to drill through the drywall of the building surface and into the support studs, a process sometimes referred to as "match drilling." After match drilling, the installer may then insert the mounting hardware through the mounting holes and into the holes that were drilled through the drywall and into the support stud to mount the frame 14 to the building surface. If, however, the holes weren't precisely drilled then the frame 14 may end up being slightly misaligned relative to the building surface, which could require restarting match drilling to ensure proper alignment of the frame 14. Or, the installer may end up having to use shims or other ad hoc structures to alter the orientation or alignment of the frame 14 relative to the generally planar building surface. This process of match drilling and ad hoc adjustment is then repeated if additional frames 14 are needed to complete the overall support structure for intended size of the display 10. And even after the entire process of mounting the support frames 14 to the building surface is completed, minor misalignments between the various frames 14 can result in problems when mounting the display modules 12 to the frames 14, such as gaps between adjacent display modules 12 or one or more of the display modules 12 being slightly out of alignment with the other display modules 12, resulting in distortion of the image, text, or video that is to be shown on the display 10.

In short, mounting the display 10 to a generally planar building surface, such as a wall, can be difficult, time-consuming, and can require multiple individual installers to perform. These challenges can thus make installation of multi-module electronic displays 10 more expensive and/or can require hiring of more skilled installers to ensure a desired visually-appealing display 10.

FIGS. 3-12 show various views of an example of support substructure 30 that can alleviate some of the problems associated with attempting to mount a resulting electronic display to a generally planar building structure, such as a wall or ceiling. The support substructure 30 includes one or more support frames 32A, 32B, 32C, 32D (collectively referred to as "frames 32" or "frame 32") that can be mounted to a generally planar building structure, such as a wall 34. The remainder of the present disclosure will describe mounting the substructure 30 to a "wall 34." However, those having skill in the art will appreciate that the substructure 30 can be configured for mounting to any generally planar building structure, including a ceiling, floor, or a group of support structures that collectively form the equivalent of a planar or generally planar building structure (such as a plurality of beams or columns with aligned or substantially aligned front surfaces, wherein the aligned front surfaces can form the equivalent of a wall surface onto which the substructure 30 can be mounted). The substructure 30 is configured to support a plurality of display modules 36 (which can be similar or identical to the display modules 12 in the display 10 of FIGS. 1 and 2) in order to mount the display modules 36 to the wall 34.

Figure 4:
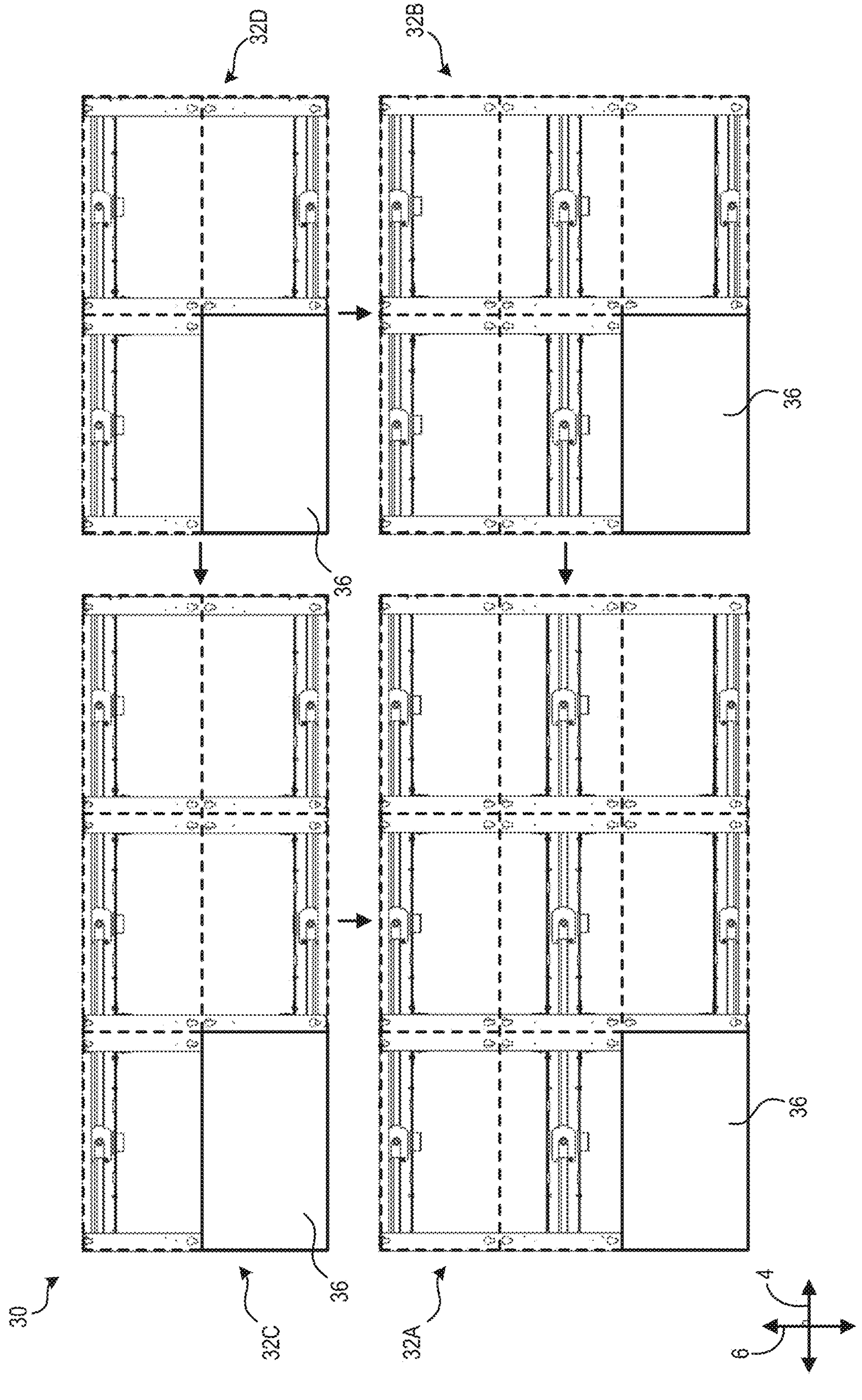
FIG. 4 is a front view of a plurality of frames that can combine to form a support substructure for supporting a plurality of display modules to form an electronic display mounted to a generally planar building surface.

The frames 32A, 32B, 32C, 32D that form the substructure 30 can be separate structures that are positioned is close proximity to one another on the wall 34 to provide an overall mounting structure onto which the display modules 36 are mounted. In an example, the separate frames 32A, 32B, 32C, 32D can be modular and can include a variety of sizes to provide for flexibility the ultimate size and dimensions of the electronic display that is formed by the frames 32. For example, as shown in FIG. 4, the substructure 30 can include modular frames 32 that are sized for mounting different numbers of the display modules 36. In the example shown in FIG. 4, the modular frames 32 include a first frame 32A that is sized to support a 3×3 array of the display modules 36 (meaning three (3) rows of display modules 36 with each row including three (3) of the display modules 36 side-by-side), a second frame 32B that is sized to support a 3×2 array of the display modules 36 (three rows with each row including two (2) of the display modules 36 side-by-side), a third frame 32C that is sized to support a 2×3 array of the display modules 36 (two (2) rows with each row including three (3) of the display modules 36 side-by-side), and a fourth frame 32D that is sized to support a 2×2 array of the display modules 36 (two (2) rows with each row including two (2) of the display modules 36 side-by-side). As shown in FIG. 4, the four different frames 32A, 32B, 32C, 32D are positioned so that when they are moved into close proximity, it will form an overall substructure 30 that can support a 5×5 display (e.g., with five (5) rows with each row including five (5) of the display modules 36 arranged side-by-side). By providing the frames 32 having the different sizes and configurations, the manufacturer of the frames 32 can allow for the formation of an overall electronic display of essentially any size. For example, the specific frames 32A, 32B, 32C, 32D shown in FIG. 4 can be mixed and matched to form a display having any size from a 2×2 array of display modules 36 (e.g., using only the fourth frame 32D and four (4) of the display modules 36) up. For example, a 2×3 display could be formed using only the third frame 32C and six (6) of the display modules 36, a 3×2 display could be formed using only the second frame 32B and six (6) of the display modules 36, a 3×3 display could be formed using only the first frame 32A and nine (9) of the display modules 36, a 2×4 or 4×2 display could be formed using two (2) of the fourth frames 32D and eight (8) of the display modules 36, a 4×4 display could be formed using four (4) of the fourth frames 32D and sixteen (16) of the display modules 36, and so on.

As described in more detail below, each frame 32 of the substructure 30 includes various features that allow for adjustment of the frame 32 in one or more directions to provide for a desired alignment of the frame 32 relative to the wall 34, which the inventors have found allow for easier installation of the substructure 30 with a reduction in the problems discuss above with respect to conventional installation of. In some examples where the substructure 30 comprises a plurality of modular frames 32 that collectively form the overall mounting substructure 30, each frame 32 can also include one or more features that provide for positioning and alignment of the frame 32 relative to other frames 32 in the substructure 30, and in particular for positioning and alignment of each frame 32 relative to an adjacent frame 32 or frames 32. The substructure 30 can also include mounting hardware for mounting the frames 32 to the wall 34 and connecting hardware for coupling the plurality of display modules 36 to the one or more frames 32 of the substructure 30.

In order to assist in the description of the adjustable alignment of the frames 32, the support substructure 30 and the electronic display that results from mounting the display modules 36 to the substructure 30 described herein will be arbitrarily defined using rectilinear Cartesian coordinates, e.g., with orthogonal axes in each dimensional direction, i.e., an x-direction that extends along an x-axis 4, a y-direction that extends along a y-axis 6, and a z-direction that extends along a z-axis 8. In the example shown in the figures, the x- and y-directions are defined as the directions in which the planar or substantially planar front faces of the display modules 36 extend, wherein the x-direction corresponds to the horizontal or lateral width of the substructure 30 and the display modules 36 and the y-direction corresponds to the vertical height of the substructure 30 and the display modules 36. The z-direction is defined as the direction into and out of the display surface of the display (e.g., corresponding to the thickness of the substructure 30 and the display modules 36). Those of skill in the art will appreciate that the x-axis 4, y-axis 6, and z-axis 8 are merely a hypothetical construct and that many other methods of defining the directions and space of the substructure 30, the display modules 36, and the resulting electronic display can be used.

In an example, each of the frames 32 of the substructure 30 includes at least a first directional adjustment mechanism for adjusting a position of at least a portion of the frame 32 relative to the wall 34 in a first direction (such as a first one of the x-direction, the y-direction, and the z-direction). In another example, each frame 32 includes both the first directional adjustment mechanism for adjusting a position of at least a portion of the frame 32 relative to the wall in the first direction and a second directional adjustment mechanism for adjusting a position of at least a portion of the frame 32 (which can be the same portion of the frame 32 that is adjusted by the first directional adjustment mechanism or a different portion) relative to the wall 34 in a second direction different from the first direction (such as a second one of the x-direction, the y-direction, and the z-direction). In an example, the first directional adjustment mechanism adjusts an alignment of at least a portion of the frame 32, e.g., by tilting at least a portion of the frame 32 relative to the wall 34, such that the first directionally adjustment mechanism may also be referred to as "the alignment mechanism." In an example, the alignment mechanism can be configured to adjust at least a portion of the frame 32 in the z-direction, i.e., by moving a portion of the frame 32 either toward or away from the wall 34 along the z-axis 8, such that the alignment mechanism may also be referred to as "the z-adjustment mechanism."

In an example, a second directional adjustment mechanism adjusts at least a portion of the frame 32 translationally across the wall 34, e.g., so that the frame 32 slides along the wall 34 while remaining in substantially the same alignment relative to the wall 34, such that the second directional adjustment mechanism may also be referred to as the translation adjustment mechanism. In an example, the translation adjustment mechanism is configured to allow translation of the frame 32 in a first direction relative to the wall 34, such as in the x-direction, i.e., by adjusting the frame 32 laterally relative to the wall 34 along the x-axis 4, such that the translation adjustment mechanism may also be referred to as "the x-adjustment mechanism." Those having skill in the art will appreciate that the frames 32 could also include a second translation adjustment mechanism (not shown in the Figures) that is configured to translate the frame 32 in a second direction that is different from the first direction. For example, a second translation adjustment mechanism could be included to adjust the frame 32 vertically relative to the wall 34 along the y-axis 6, such that the second translation adjustment mechanism could be referred to as a "y-adjustment mechanism." Those having skill in the art will also appreciate that the second translation adjustment mechanism may not be necessary because an installer of the frame 32 could manually move the frame 32 in the second direction and could rely on the first translation adjustment mechanism to adjust the frame 32 in the first direction and/or on the alignment mechanism for adjusting the alignment of the frame 32 relative to the wall 34.

Figure 5:
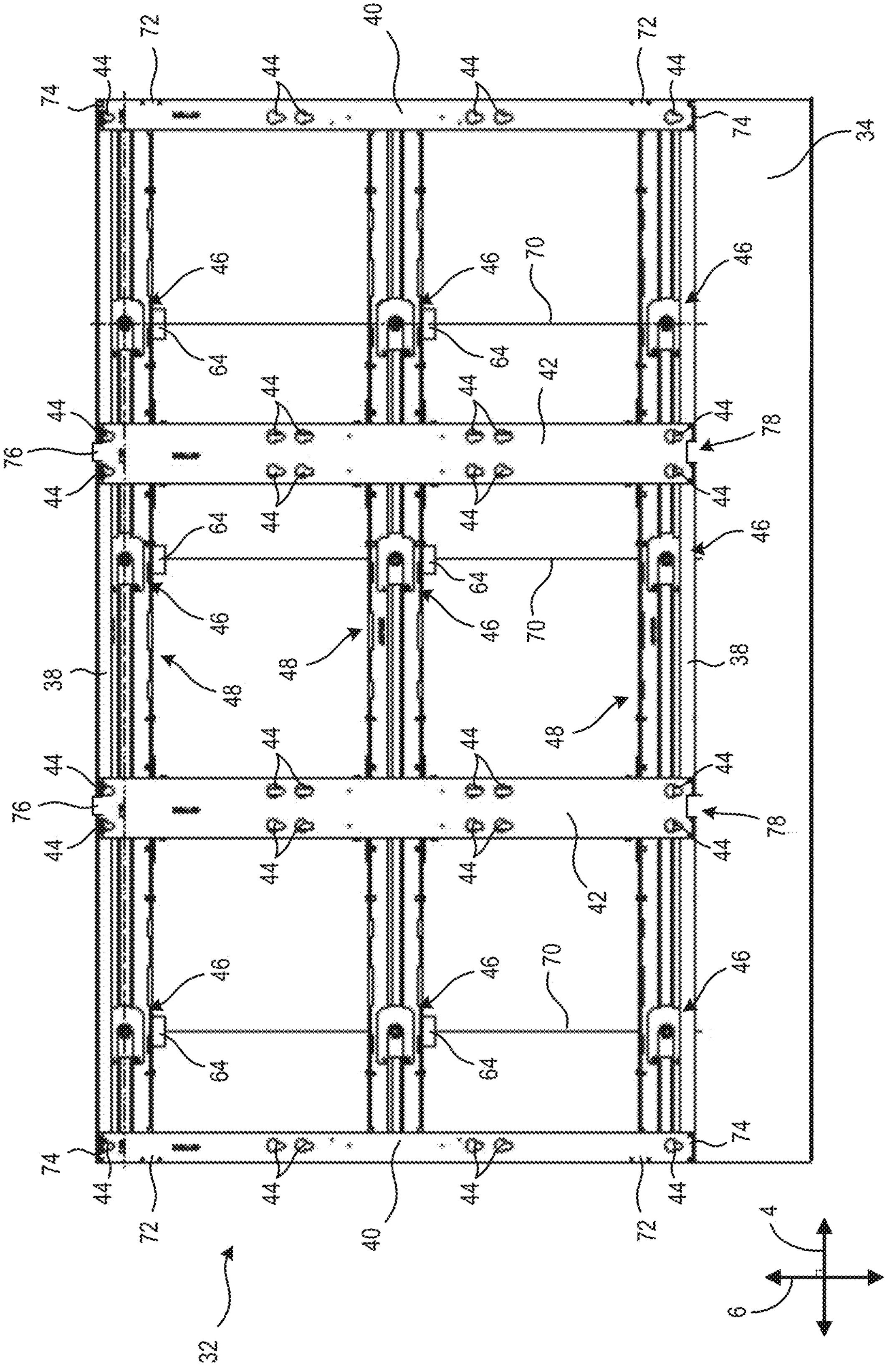
FIG. 5 is a front view of one of the frames of the example support substructure of FIG. 4.
Figure 6:
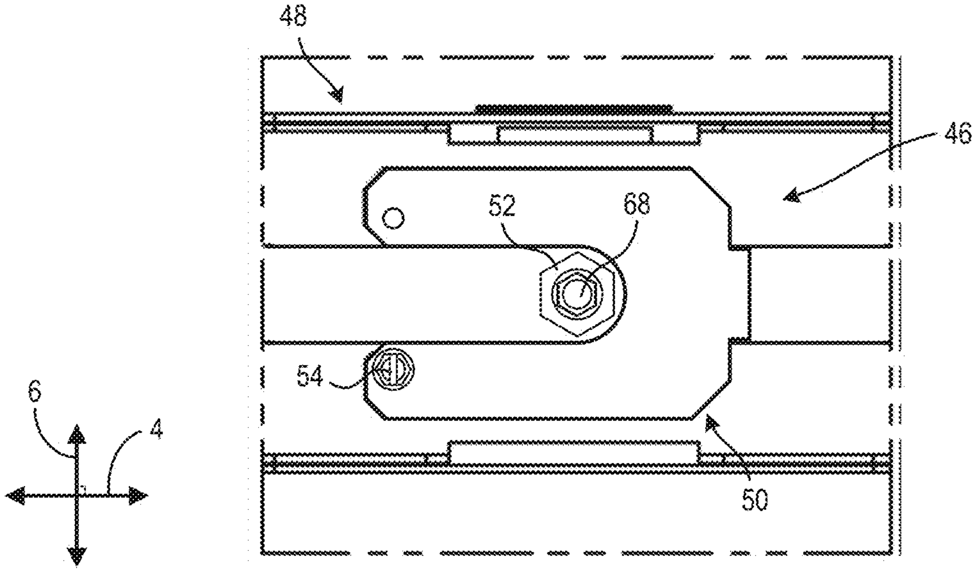
FIG. 6 is a close-up front view of an example bolt assembly with directional adjustment mechanisms of the example frame of FIG. 5.
Figure 7:
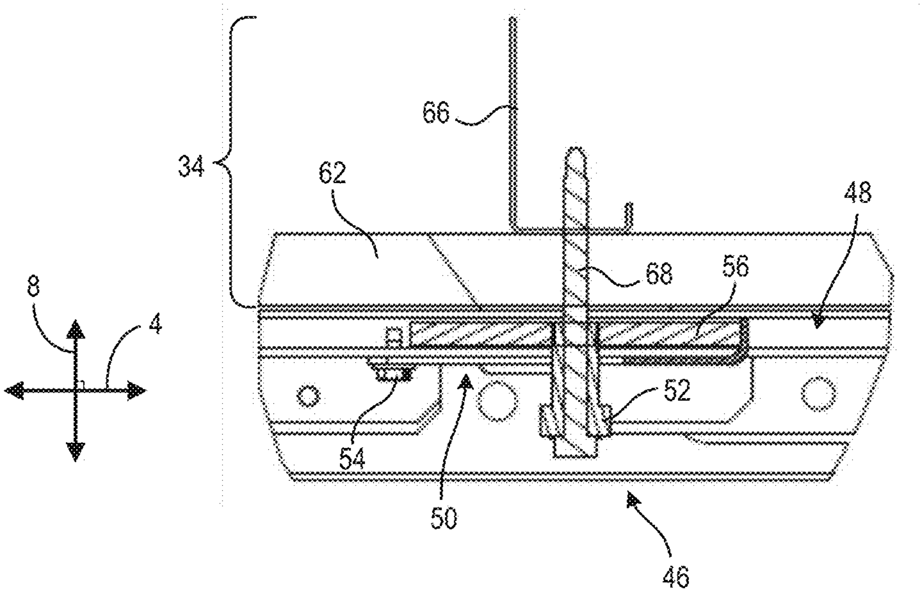
FIG. 7 is a cross-sectional top view of the example bolt assembly of FIG. 6.
Figure 8:
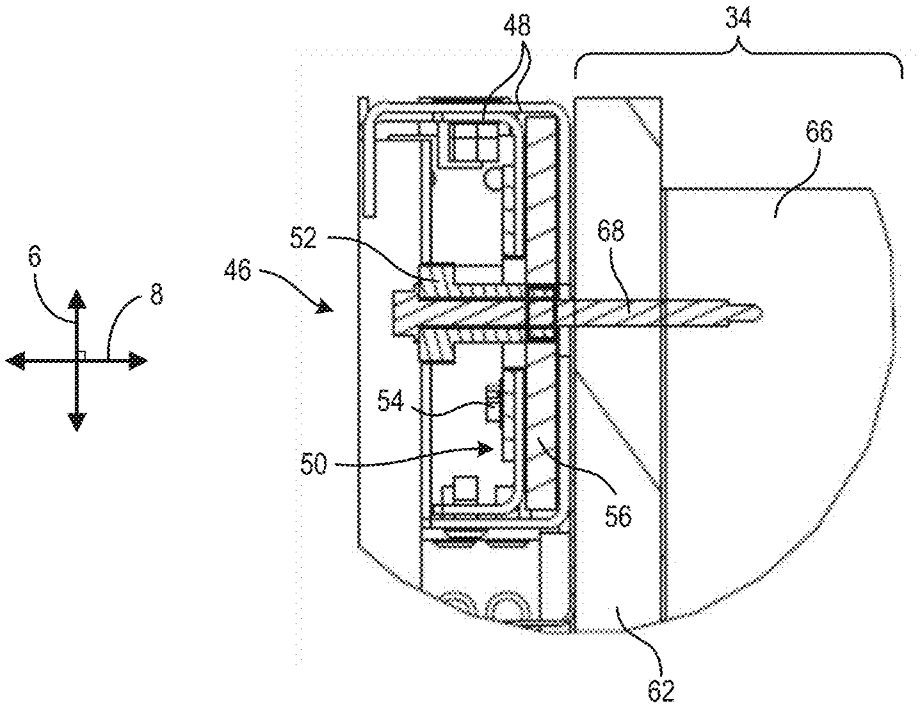
FIGS. 8 and 9 are cross-sectional side views of the z-adjustment mechanism of the example bolt assembly of FIG. 6 in a retracted position and an extended position.
Figure 9:
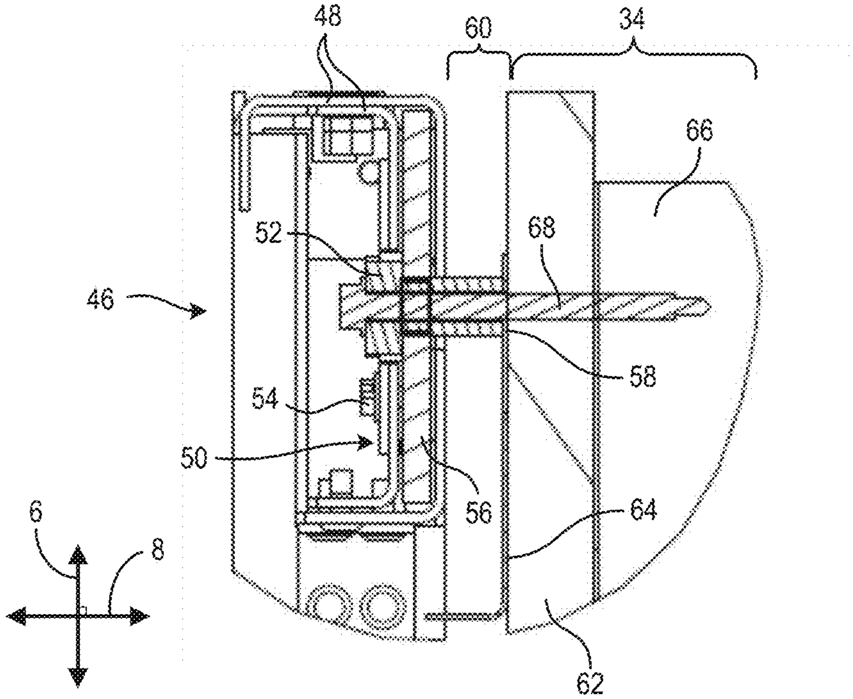

FIGS. 5-9 show various views of specific, non-limiting examples, of a z-adjustment mechanism and an x-adjustment mechanism that can be used to adjust a frame 32 relative to the wall 34 in one or both of the z-direction and the x-direction. As described in more detail below, the x-adjustment mechanism and the z-adjustment mechanism can be formed as part of a common mechanism. However, those having skill in the art will appreciate that the x-adjustment mechanism and the z-adjustment mechanism can be split into separate structural mechanisms without varying from the scope of the present disclosure. FIG. 5 is a front view of an entire one of the frames 32 (i.e., the first example frame 32A from FIG. 4), which shows the positions of the components that make up the mechanism that provides for the x-adjustment mechanism and the z-adjustment mechanism relative to the rest of the frame 32. FIG. 6 shows a close-up front view of the structures of the common mechanism that provides for the x-adjustment mechanism and the z-adjustment mechanism. FIG. 7 shows a top cross-section view (e.g., looking downward in the y-direction) of the mechanism, which shows structures that are useful in both the x-adjustment mechanism and the z-adjustment mechanism. FIGS. 8 and 9 show a side cross-sectional view (e.g., looking laterally in the x-direction), which shows the action of the z-adjustment mechanism to adjust the frame 32 in the z-direction relative to the wall 34.

As shown in FIGS. 5-9, in an example, the frame 32 includes horizontal members 38 and vertical members 40 that form the outer edges of the frame 32. The frame 32 can also include interior members 42 that extend across an interior portion of the frame 32, for example vertically in the example shown in FIG. 5. The members 38, 40, 42 can include structures for mounting the display modules 36 to the frame 32. In the example shown in FIG. 5, the frame 32 includes mounting holes 44 that can each receive a mounting fastener such as a bolt. In an example, the mounting holes 44 are positioned along the members 38, 40, 42 so that there is a mounting hole 44 located proximate to where each corner of a corresponding display module 36 will be located when the display module 36 is mounted. The mounting fasteners can then be inserted through the mounting holes 44 and fastened to the display module 36 such that the display module 36 is secured to the frame 32 at its corners.

In an example, the s-adjustment mechanism includes a bolt assembly 46 at several positions along the area of the frame 32. Each bolt assembly 46 is coupled to the rest of the frame 32 so that if desired, the bolt assembly 46 can be locked in place so that the bolt assembly 46 does not move in the z-direction with respect to the rest of the frame 32. In an example, the frame 32 includes one or more tracks 48 that are securely coupled to one or more of the members 38, 40, 42 of the frame 3, and each bolt assembly 46 can be coupled to a corresponding one of the tracks 48 such that the bolt assembly 46 is securable to the frame 32. In an example, each bolt assembly 46 includes a main body 50 and an adjustment bolt 52. The main body 50 can be coupled to the track 48, such as with a fastener 54 (as shown in FIGS. 6 and 7), to lock the main body 50 relative to the track 48.

In an example, the adjustment bolt 52 is movably engaged with the main body 50 so that the adjustment bolt 52 moves in and out in the z-direction relative to the main body 50 (and therefore also in and out in the z-direction relative to the frame 32). In an example (best seen in FIGS. 8 and 9), the adjustment bolt 52 is a threaded bolt that threadingly engages with a threaded plate 56 that is part of the main body 50 of the bolt assembly 46. As the adjustment bolt 52 is rotated, its threads engage with corresponding threads on the threaded plate 56 to drive the adjustment bolt 52 in the z-direction toward or away from the wall 34 relative to the threaded plate 56. As the adjustment bolt 52 moves toward the wall 34, a distal end 58 of the adjustment bolt 52 can come into contact with the wall 34 and push the threaded plate 56 away from the wall 34 in the z-direction. The threaded plate 56 then pushes the rest of the main body 50, which then pushes the track 48 away from the wall 34, resulting in a the formation of a gap 60 between the frame 32 and the wall 34 at the position of the particular bolt assembly 46, as shown in the comparison of FIG. 8 (where the distal end 58 of the adjustment bolt 52 is fully retracted relative to the threaded plate 56) and FIG. 9 (where the distal end 58 of the adjustment bolt 52 is extended past the threaded plate 56 as is pushing against the wall 34). In an example, wherein the surface of the wall 34 onto which the frame 32 is being mounted is formed by a friable material, such as drywall 62, a backing plate 64 can be included and positioned between the drywall 64 and the distal end 58 to provide a more solid surface for the distal end 58 of the adjustment bolt 52 to push against when moving the frame 32 in the z-direction so that the adjustment bolt 52 does not sink into the drywall 62 or other friable material of the wall 34.

As will be appreciate by those having skill in the art, it is common for a wall 34 to be formed by mounting drywall 62 to a plurality of support studs 66 (such as wooden studs or sheet metal support studs). When mounting relatively heavy structures, such as the frame 32, to a wall 34 made from drywall 62, it is common to fasten the heavy structure directly to the support studs 66, such as with a special stud fastener 68 that is configured to securely engage with the material of the stud 66. In an example, the stud fastener 68 comprises a self-tapping screw that can engage with the material of the stud 66, such as a steel-tapping TEK screw if the stud 66 is a steel stud 66. In an example, shown in FIGS. 8 and 9, the adjustment bolt 52 is a hollow-bored bolt where the bore through the adjustment bolt 52 is sized to accommodate the shaft of the stud fastener 68, which can allow the stud fastener 68 to slide freely with in the bore of the adjustment bolt 52. In an example, an installer can select a desired position of the frame 32 relative to the wall 34 by screwing the adjustment bolt 52 to a desired position relative to the threaded plate 56 (e.g., to select a specified length of the shaft of the adjustment bolt 52 that is extended beyond the threaded plate 56 in order to push the frame 32 a specified distance away from the wall 34), and then the installer can tighten down the stud fastener 68 into the stud 66 such that the head of the stud fastener 68 pushes inward against the head of the adjustment bolt 52 and clamps the distal end 58 of the adjustment bolt 52 into the wall 34, essentially locking the bolt assembly 46 into a desired z-position relative to the wall 34. The engagement of the stud, fastener 68 with the stud 66 also acts to lock the bolt assembly 46 into place in the x- and y-directions relative to the wall 34 as well.

As can best be seen in FIG. 5, each frame 32 can include a plurality of the bolt assemblies 46 located at various locations along the length and height of the frame 32. The plurality of bolt assemblies 46 at the various locations allows the z-adjustment mechanism of the bolt assemblies 46 to be used at the various locations, which gives an installer freedom to fine-tune the overall orientation of the frame 32 relative to the wall 34 in order to ensure that the frame 32 is properly oriented (e.g., level and plumb). The z-adjustment ability of the bolt assemblies 46 also allows the installer the ability to lock down the frame 32, check its orientation (e.g., using levels), and to pick and choose specific locations along the length and height of the frame 32 to slightly adjust in the z-direction if further leveling is needed (described in more detail below). This ease of z-adjustment is a considerable improvement over the conventional methods of installing support substructures described above.

The x-adjustment mechanism provides a means to adjust a position of the frame 32 relative to the wall in the x-direction. In an example, x-adjustment mechanism is also embodied in the bolt assemblies 46 described above. As noted above, the main body 50 of each bolt assembly 46 can be engaged with a corresponding track 48 of the frame 32. The main body can be configured so that it can slide along the track 48. If the track 48 is oriented in the x-direction, then the ability to slide the bolt assembly 46 along the track 48 results in the ability to translate the bolt assembly 46 relative to the rest of the frame 32. And since the bolt assembly 46 attaches to the wall 34 (e.g., via the stud fastener 68 engaging the stud 66), the ability to slide the bolt assembly 46 relative to the rest of the frame 32 allows for the rest of the frame 32 to be translated relative to the wall 34 as well.

In practice, the x-adjustment aspect of the bolt assemblies 46 (e.g., the ability to slide along the tracks 48 in the x-direction) allows an installer to first position the frames 32 at a desired position relative to the wall 34 (e.g., by pushing the frame 32 up against the drywall 62 at the desired position), and then to slide each bolt assembly 46 into a desired position along the x-direction, for example to position the bolt assembly 46 directly in front of the location of a stud 66 so that the stud fastener 68 can be screwed into the stud 66. For example, as best seen in FIG. 5, the studs 66 can be positioned at regular intervals (such as at sixteen (16) inches, center-to-center spacing), which is indicated by the stud lines 70 on the wall 34 in FIG. 5 (wherein the stud lines 70 correspond to the longitudinal center line of the studs 66). However, if the desired position of the frame 32 along the wall 34 did not directly line up with frame mounting holes with the stud lines 70, then it would be difficult to ensure proper mounting to the studs 66 without first drilling new holes in the frame 32 (which can require the practice of match drilling discussed above). But the ability of the bolt assemblies 46 to slide along the tracks 48 in the x-direction allows the installer to position the bolt assemblies 46 at irregular positions along the length of the frame 32 and still ensure engagement between the bolt assembly 46 and the stud 66 without having to drill new holes in the frame.

In addition, the ability of the bolt assemblies 46 to be slid along the tracks 48 can also allow for slight adjustment of the position of the frame 32 in the x-direction relative to the wall 34 and/or relative to another frame 32 that is part of the support substructure 30 without having to completely unfasten the frame 32 from the wall 34. For example, the installer could slightly loosen the stud fastener 68 so that the adjustment bolt 52 is no longer clamped between the head of the stud fastener 68 and the wall 34 and could loosen the track fastener 54, then the installer could slide the frame 32 in the x-direction relative to the wall 34 while the stud fasteners 68 still remain engaged with the stud 66 until the frame 32 is translated to a desired position, and then the track fastener 54 could be tightened to lock the main body 50 relative to the track 48 and the stud fastener 68 could be tightened down to clamp the adjustment bolt 52 into the wall 34, as described above.

In an example, each frame 32 can also include one or more additional structures to assist in aligning one frame 32 of the substructure 30 with another frame 32 of the substructure 30. For example, as shown in the example substructure 30 of FIGS. 3 and 4, a first frame 32A is located at a bottom left position of the substructure 30 (when standing in front of the substructure 30 and looking toward the wall 34 and the substructure 30), a second frame 32B is located directly to the right of the first frame 32A, a third frame 32C is located directly above the first frame 32A, and a fourth frame 32D is located directly above the second frame 32B and directly to the right of the third frame 32C. Each of the frames 32 can include one or more alignment structures, e.g., to assist an installer in positioning the second frame 32B relative to the first frame 32A so that the second frame 32B is directly to the right of the first frame 32A, in positioning the third frame 32C so that it is directly above the first frame 32A, and in positioning the fourth frame 32D so that it is directly above the second frame 32B and directly to the right of the third frame 32C.

Figure 10:
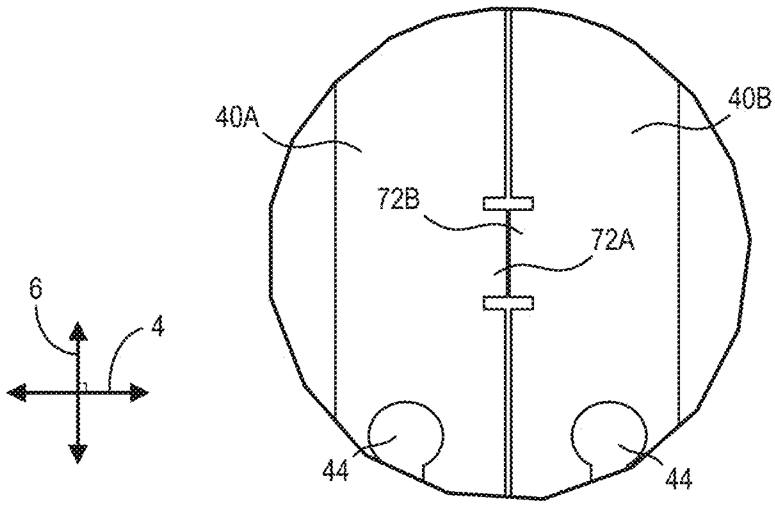
FIG. 10 is a front view of an example alignment structure for aligning adjacent frames of the substructure of FIG. 4 in the y-direction.

In an example, each frame 32 can include one or more first alignment structures to assist in alignment of the frame 32 in a first direction (e.g., in the y-direction) and one or more second alignment structures to assist in alignment of the frame 32 in a second direction (e.g., in the x-direction) (as described above, adjustment in the z-direction can be achieved via the z-adjustment mechanism of the bolt assemblies 46). In a non-limiting example, shown in FIGS. 5 and 10, the first alignment structures (e.g., the y-direction alignment structures) can include one or more alignment tabs 72 positioned at specified locations along the outer vertical members 40 to align one frame 32 with another frame 32 in the y-direction, also referred to as y-alignment tabs 72. When an installer wants to align, for example, the first frame 32A in the y-direction relative to the second frame 32B, the installer can position each y-alignment tab 72A on the vertical member 40A of the first frame 32A with a corresponding y-alignment tab 72B on the adjacent vertical member 40B of the second frame 32B (as shown in FIG. 10). In an example, the y-alignment tabs 72A and 72B have the exact same size and are at the exact same vertical position along their corresponding frames 32A and 32B, so that when the y-alignment tabs 72A of the first frame 32A are each aligned with their corresponding y-alignment tabs 72B on the second frame 32B, then the first frame 32A is aligned with the second frame 32B in the y-direction. Similar alignment of y-alignment tabs 72 on the third and fourth frames 32C, 32D can be performed to align those frames 32C, 32D in the y-direction. In the example shown in FIG. 10, the y-alignment tabs are configured mainly as a visual aid to assist the installer in positioning two frames 32 that are intended to be located laterally adjacent to one another (e.g., the first and second frames 32A, 32B) in the y-direction relative to one another. In other words, the y-alignment tabs 72 shown in FIG. 10 do not physically engage with one another to ensure alignment in the y-direction. Rather, the installer still must actually align the frames 32A and 32B with respect to one another in the y-direction, e.g., by sliding the second frame 32B up and down in the y-direction relative to the first frame 32A, or vice versa.

Figure 11:
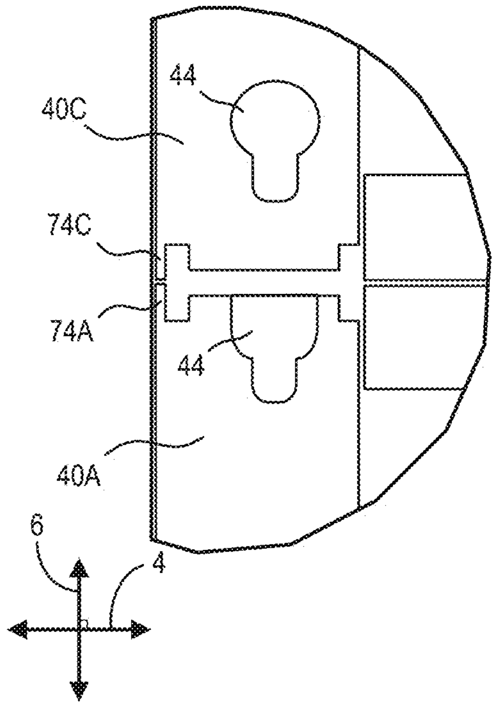
FIGS. 11 and 12 are front views of example alignment structures for aligning adjacent frames of the substructure of FIG. 4 in the x-direction.

In a non-limiting example, shown in FIGS. 5 and 11, a similar set of alignment tabs 74 can be implemented along the bottom and top of each frame 32 to align one frame 32 with another frame 32 in the x-direction, also referred to as x-alignment tabs 74. The x-alignment tabs 74 can be positioned at a specified position along the top and bottom edges of the frame 32, for example at the top and bottom ends of the vertical members 40 (as shown in FIGS. 5 and 10). When an installer wants to align, for example, the first frame 32A in the x-direction relative to the third frame 32C, the installer can position each x-alignment tab 74A of the first frame 32A (e.g., on the top end of the vertical member 40A) with a corresponding x-alignment tab 74C on the adjacent third frame 32C (e.g., on the bottom end of the vertical member 40C) (as shown in FIG. 11). Similar to the example of the y-alignment tabs 72 described above, the x-alignment tabs 74A and 74B can have the exact same size and can be at the exact same horizontal position along their frames 32A, 32C, so that when the x-alignment tabs 74A on the first frame 32A are each aligned with the corresponding x-alignment tabs 74C on the third frame 32C, then the first frame 32A will be aligned with the third frame 32C in the x-direction. Similar alignment of x-alignment tabs 74 on the second and fourth frames 32B, 32D can be performed to align those frames 32B, 32D in the x-direction. In the example shown in FIG. 11, the x-alignment tabs 74 are configured like the y-alignment tabs 72 described above, e.g., mainly as a visual aid to assist the installer in positioning two frames 32 that are intended to be located vertically adjacent to one another (e.g., the first and third frames 32A, 32C) in the y-direction relative to one another. In other words, the x-alignment tabs 74 shown in FIG. 11 do not physically engage with one another to ensure alignment in the x-direction, and rather the installer still must actually align the frames 32A and 32C with respect to one another in the x-direction, e.g., by sliding the third frame 32C left or right in the x-direction relative to the first frame 32A, or vice versa.

Figure 12:
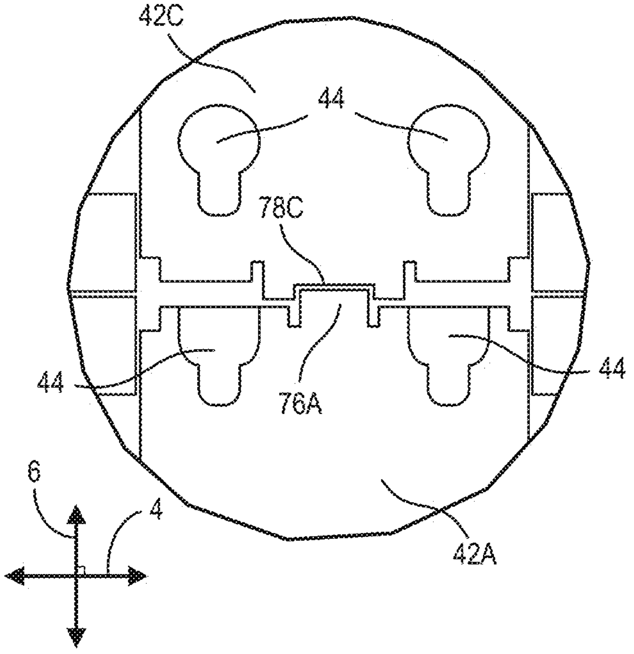

In a non-limiting example, the second alignment structures for alignment of the frames 32 in the x-direction can also include a second type of alignment structure that more actively engages with one another to ensure alignment between adjacent frames 32. Specifically, as shown in the examples of FIGS. 5 and 12, each frame 32 can include an alignment tab 76 on one side of the frame 32 (e.g., on the top or bottom of the frame 32) and a corresponding alignment slot 78 on an opposing side of the frame 32 (e.g., with the alignment slot 78 on the bottom of the frame 32 if the alignment tab 76 is on the top or with the alignment slot 78 on the top of the frame 32 if the alignment tab 76 is on the bottom). As is best seen in FIG. 12, the alignment tab 76 and the alignment slot 78 have complimentary sizes and shapes such that the alignment tab 76 will fit inside the alignment slot 78 with an interference fit so that once the tab 76 is fit into the slot 78, the interference fit prevents the frames 32 from being moved in the x-direction more than a fraction of a millimeter before the tab 76 comes into contact with a side wall that defines the slot 78. In the example shown in FIG.

12, an alignment tab 76A is located along the top of the first frame 32 (e.g., at an upper end of one of the interior members 42A of the first frame 32A) and a corresponding alignment slot 78C is located at a corresponding position along the bottom of the third frame 32C (e.g., at a lower end of a corresponding interior member 42C of the third frame 32C). When an installer wishes to align the frames 32A, 32C using the combination of the tab 76A and the slot 78C, the installer can move the third frame 32C into position relative to the first frame 32A, or vice versa, so that the alignment tab 76A on the first frame 32A slides into position at least partially within the alignment slot 78C in the third frame 32C to provide for the interference fit described above. Once this alignment is achieved, the installer can lock the frames 32A, 32C into place (e.g., using the bolt assemblies 46 and the tracks 48 described above). The interference fit between the alignment tab 76A and the alignment slot 78C can prevent inadvertent movement of the frames 32A, 32C relative to each other in the x-direction while the installer performs other tasks, such as checking alignment of one or both of the frames 32A, 32C or engaging the fastening structures that mount one or both of the frames 32A, 32C to the wall 34. As will be appreciated by those having skill in the art, the positions of the alignment tab 76 and the alignment slot 78 could be reversed, i.e., with an alignment slot 78A of the first frame 32A being along the top of the first frame 32A and with an alignment tab 76C of the third frame 32C being along the bottom of the third frame 32C. Similarly, those having skill in the art will appreciate that similar mating tab and slot structures could be used for alignment in the y-direction.

Figure 13A:
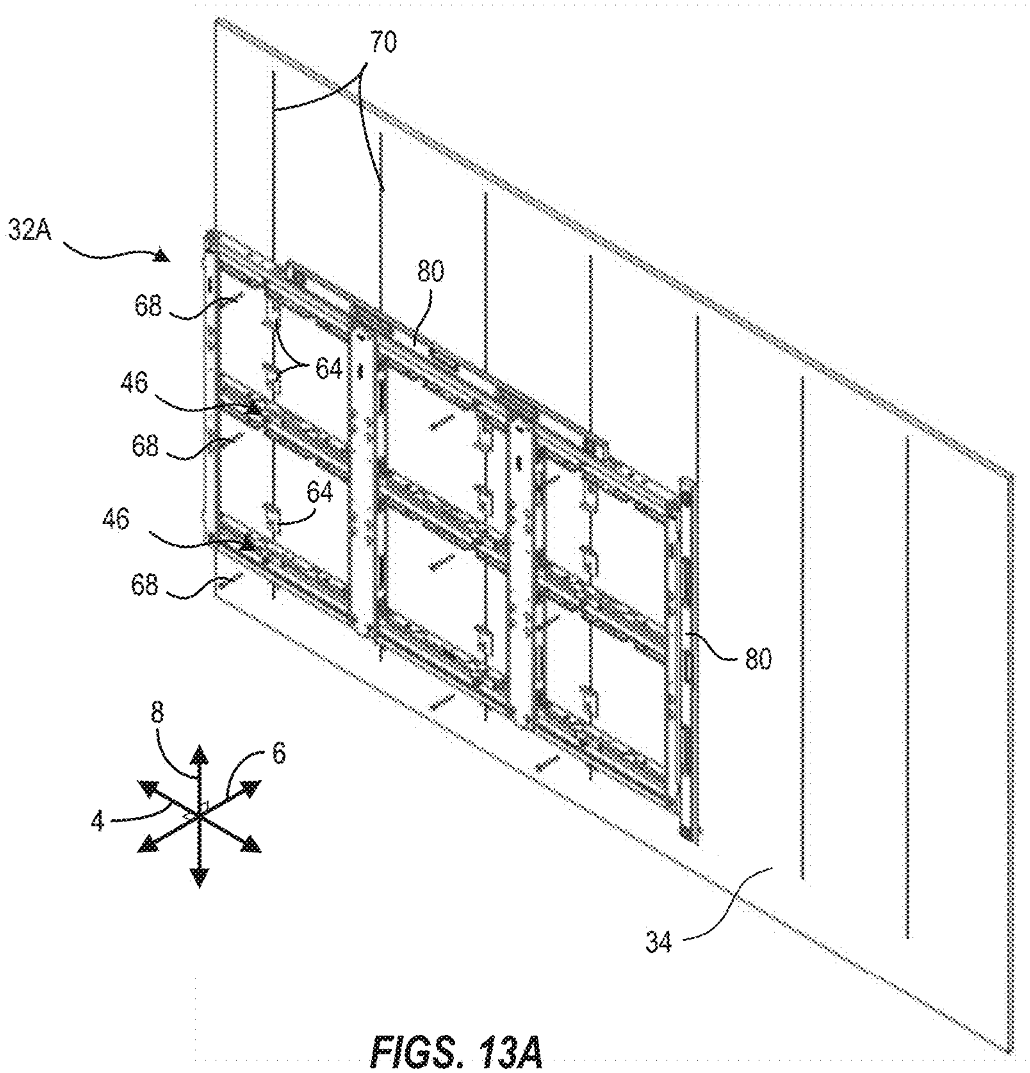
FIGS. 13A-13G are various views in a method of installing a support substructure comprising a plurality of frames to form an electronic display mounted to a generally planar building surface.
Figure 13B:
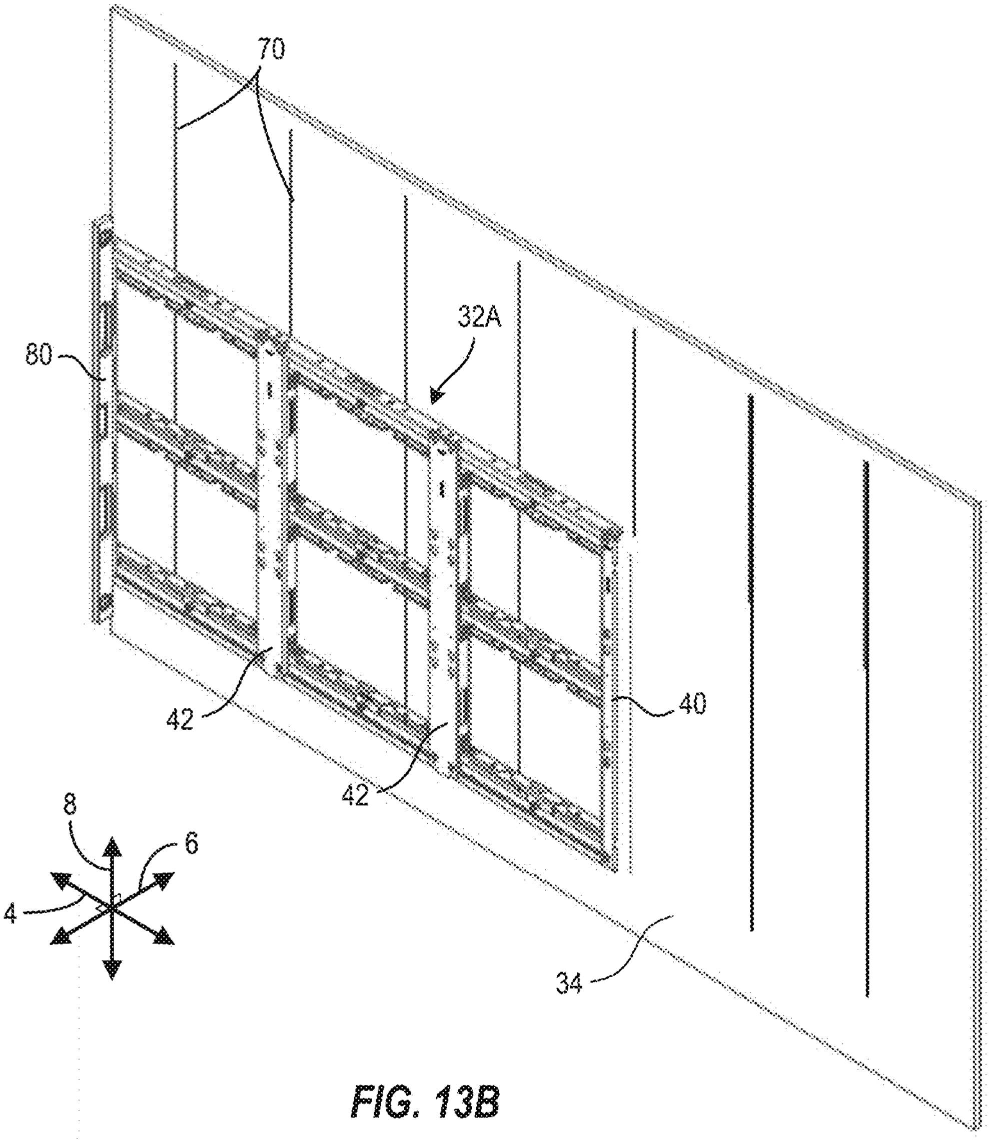

Turning to FIGS. 13A-13G, an example method of installing a substructure 30 comprising a plurality of frames 32A, 32B, 32C, 32D will be described. In an example, the method starts by positioning a first of the frames 32 (e.g., the first frame 32A) relatively to the wall 34, as shown in FIG. 13A. Positioning the first frame 32A can include first locating the support studs 66 within the wall 34, such as with a stud finder, which can also include marking the wall 34 (e.g., the surface of the drywall 62) with indicia of the studs 66 (e.g., the stud lines 70). Positioning of the first frame 32A can also include aligning the first frame 32A relative to the wall 34, such as with one or more levels 80.

Once the first frame 32A is positioned and/or aligned in a desired position relative to the wall 34, the method can include positioning the x-adjustment mechanisms and/or the z-adjustment mechanisms of the first frame 32A into position relative to the wall 34. In the example described above, where both the x-adjustment mechanism and the z-adjustment mechanism are embodied in the bolt assemblies 46, this can include sliding the bolt assemblies 46 along their corresponding tracks 48 so that each bolt assembly 46 is positioned in front of a corresponding one of the studs 66 (e.g., in front of one of the stud lines 70). Then, the method can include mounting the first frame 32A to the wall 34, such as by inserting the stud fasteners 68 through the frame 32A (e.g., through the bolt assemblies 46 of the first frame 32A) and screwing the stud fasteners 68 into the wall 34 so that the stud fasteners 68 can engage and tap into the support studs 66. In an example, once the stud fasteners 68 are at least partially inserted into the wall 34, the backing plates 64 can be positioned onto the stud fasteners 68, such as by hooking the backing plates 64 onto the stud fasteners 68.

Next, the method can include performing z-adjustment of the first frame 32A using the z-adjustment mechanisms of the first frame 32A. In an example, z-adjustment of the first frame 32A can include first checking the alignment of the first frame 32A, such as by checking the alignment of the vertical members 40, 42 of the first frame 32A using one or more levels 80. If the alignment of the first frame 32A is not as desired, e.g., if one of more of the vertical members 40, 42 are not plumb relative to the wall 34, then the z-adjustment mechanisms can be used to alter the position of one or more portions of the first frame 32A relative to the wall 34 in the z-direction. Specifically, adjusting the z-position of the first frame 32A can include identifying which of the bolt assemblies 46 should be adjusted and in which direction (e.g., inward toward the wall 34 or outward away from the wall 34), followed by adjusting the adjustment bolts 52 of the identified bolt assemblies 46 to provide for the desired adjustment in the z-direction. Adjusting each specific bolt assembly 46 can include first loosening the stud fastener 68 of the bolt assembly 46 enough so that the adjustment bolt 52 can be moved (e.g., so that the adjustment bolt 52 is not clamped between the head of the stud fastener 68 and the wall 34), rotating the adjustment bolt 52 to move the adjustment bolt 52 relative to the threaded plate 56 (e.g., so that the distal end 58 of the adjustment bolt 52 pushes against the wall 34 or against the backing plate 64 and pushes the portion of the first frame 32A at the bolt assembly 46 away from the wall 34), and then retightening the stud fastener 68 (e.g., to clamp the adjustment bolt 52 between the head of the stud fastener 68 and the wall 34).

Figure 13C:
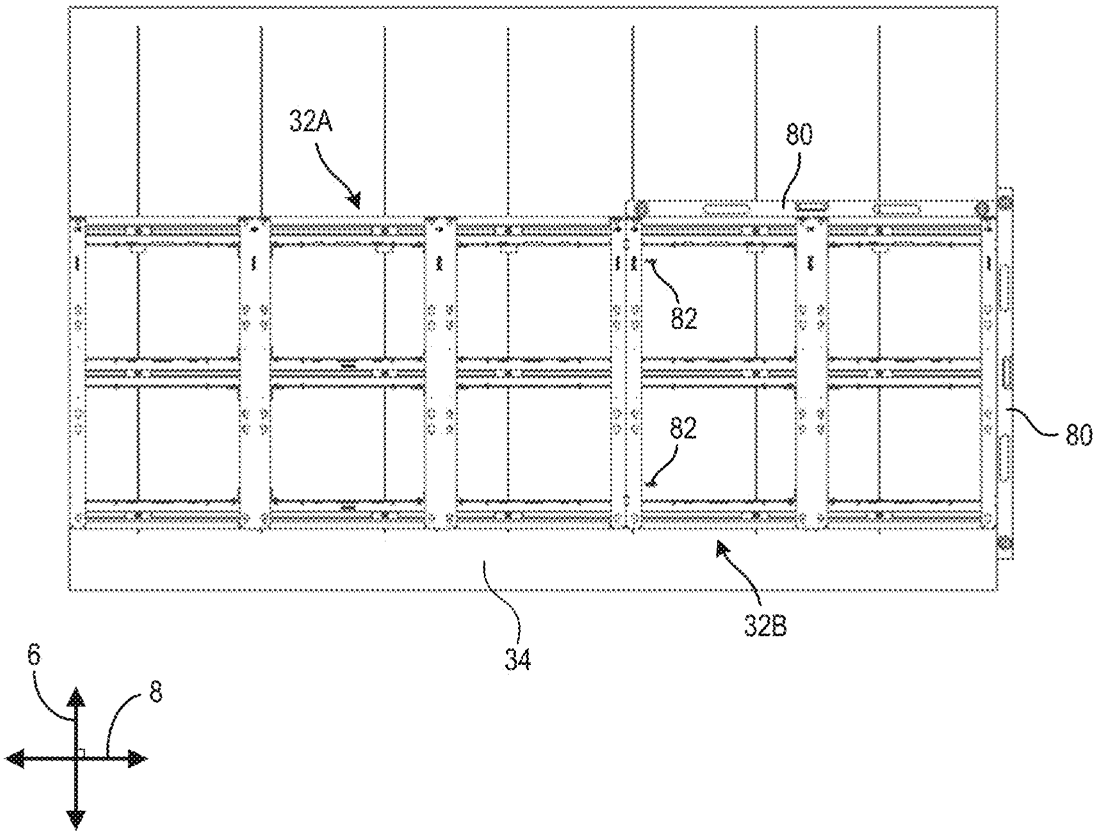

Once the first frame 32A has been adjusted in the z-direction, the method can include positioning the second frame 32B relative to the first frame 32A, as shown in FIG. 13C. Positioning the second frame 32B relative to the first frame 32A can include moving the second frame 32B into a position relative to the wall 34 that is adjacent to the first frame 32A and then aligning the y-alignment tabs 72 of the first and second frames 32A, 32B so that the first frame 32A and the second frame 32B are aligned in the y-direction relative to one another (as described above with respect to FIG. 10). Positioning the second frame 32B relative to the first frame 32A can also include aligning the second frame 32B relative to the first frame 32A and/or relative to the wall 34, such as with one or more levels 80. Once the second frame 32B is positioned relative to the first frame 32A and the wall 34, the method can include fastening the second frame 32B to the first frame 32A, such as with one or more stitch bolts 82.

Next, the method can include positioning the x-adjustment mechanisms and/or the z-adjustment mechanisms of the second frame 32B into position relative to the wall 34. This can be similar or identical to this step as described above for the first frame 32A (e.g., sliding the bolt assemblies 46 into position in front of a corresponding one of the studs 66). Then, the method can include mounting the second frame 32B to the wall 34, which can be similar or identical to this step as described above for the first frame 32A (e.g., inserting the stud fasteners 68 through the bolt assemblies 46 of the second frame 32B, screwing the stud fasteners 68 into the wall 34, positioning the backing plates 64 onto the stud fasteners 68, and tightening down the stud fasteners 68 to lock the bolt assemblies 46 into place).

Next, the method can include performing z-adjustment of the second frame 32B using the z-adjustment mechanisms of the second frame 32B, which can be similar or identical to the z-adjustment described above with respect to the first frame 32A (e.g., checking the alignment of the second frame 32B such as with one or more levels 80, identifying which of the bolt assemblies 46 should be adjusted and in which direction, and then adjusting the adjustment bolts 52 of the identified bolt assemblies 46 to provide for the desired adjustment in the z-direction).

The preceding steps can be repeated for each frame 32 in the first row of the substructure 30. In the example shown in the Figures, there are only two frames 32 (i.e., the first and second frames 32A and 32B) in the first row.

Figure 13D:
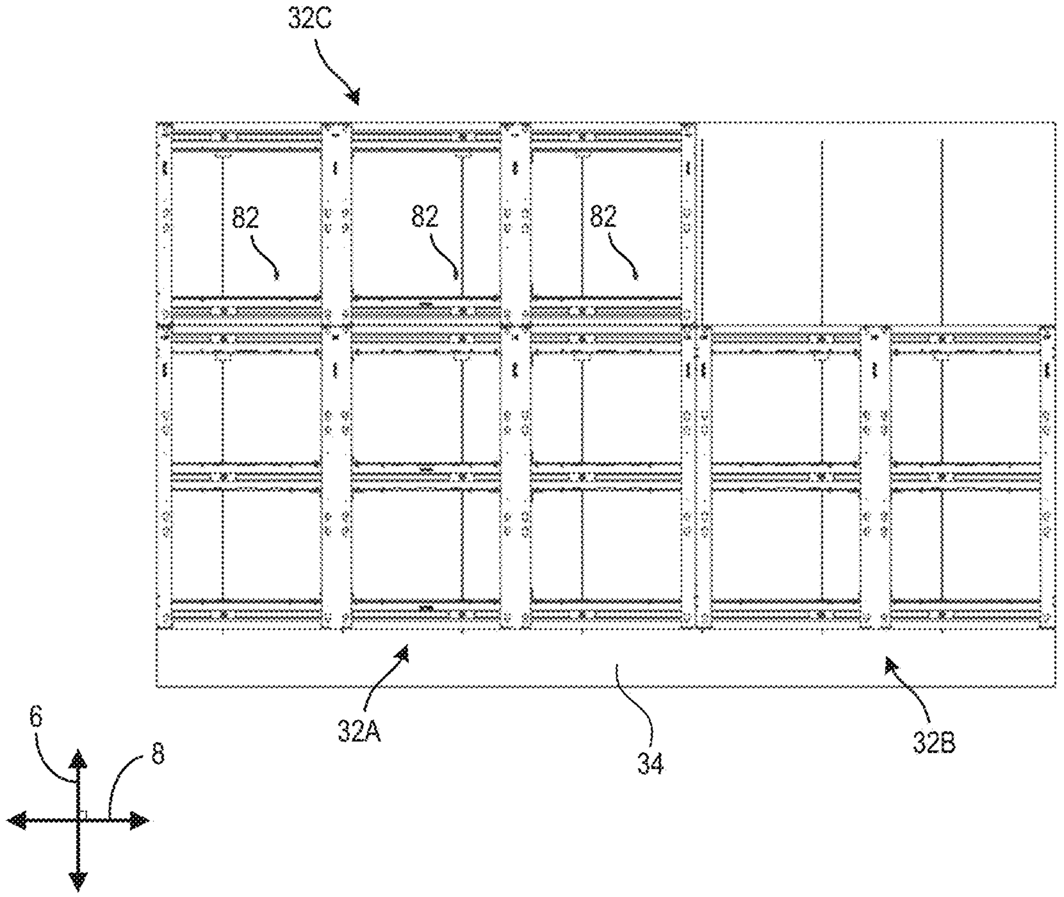

Next, the method can include positioning one of the frames 32 of an adjacent row relative to the already installed frames 32, such as by positioning the third frame 32C relative to the first frame 32A, as shown in FIG. 13D. Positioning the third frame 32C relative to the first frame 32A can include moving the third frame 32C into a position relative to the wall 34 that is above and adjacent to the first frame 32A and then aligning the x-alignment structures (e.g., the x-alignment tabs 74 and/or the mating alignment tabs 76 and alignment slots 78) of the first and third frames 32A, 32C so that the third frame 32C is aligned in the x-direction relative to the first frame 32A (as described above with respect to FIGS. 11 and 12). Positioning the third frame 32C relative to the first frame 32A can also include aligning the third frame 32C relative to the first frame 32A and/or relative to the wall 34, such as with one or more levels (not shown in FIG. 13D). Once the third frame 32C is positioned relative to the first frame 32A and the wall 34, the method can include fastening the third frame 32C to the first frame 32A, such as with one or more stitch bolts 82.

Figure 13E:
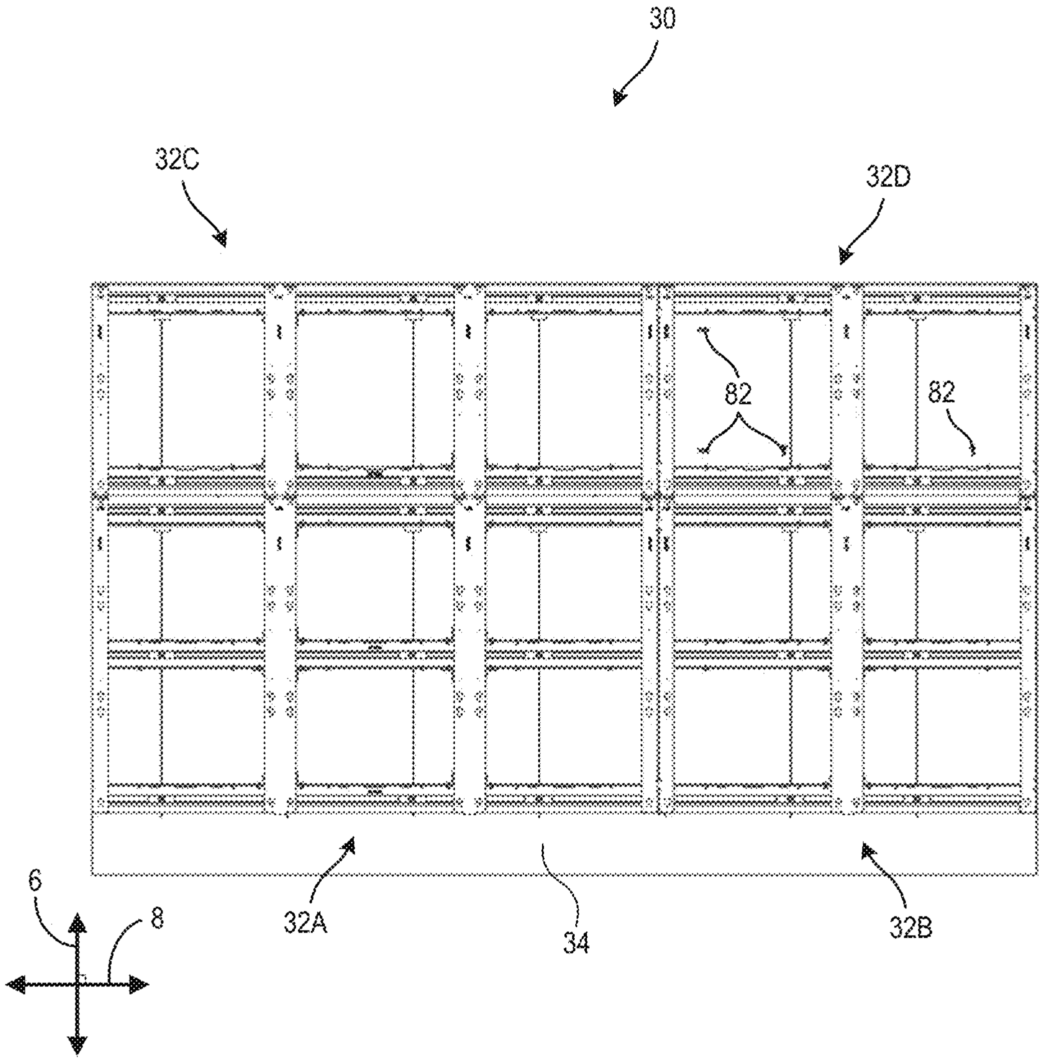

Next, the method can include positioning the x-adjustment mechanisms and/or the z-adjustment mechanisms of the third frame 32C into position relative to the wall 34, which can be similar or identical to this step as described above for the first and second frames 32A, 32B. Next, the method can include performing z-adjustment of the third frame 32C using the z-adjustment mechanisms of the third frame 32C, which can be similar or identical to the z-adjustment described above with respect to the first and second frames 32A, 32B. The preceding steps can be repeated for the remaining frames 32 in the second row, e.g., for the fourth frame 32D, as shown in FIG. 13E. Additional rows of frames 32 (e.g., a third row above the third and fourth frames 32C, 32D, a fourth row above that, and so on) can be installed via similar or identical steps.

Figure 13F:
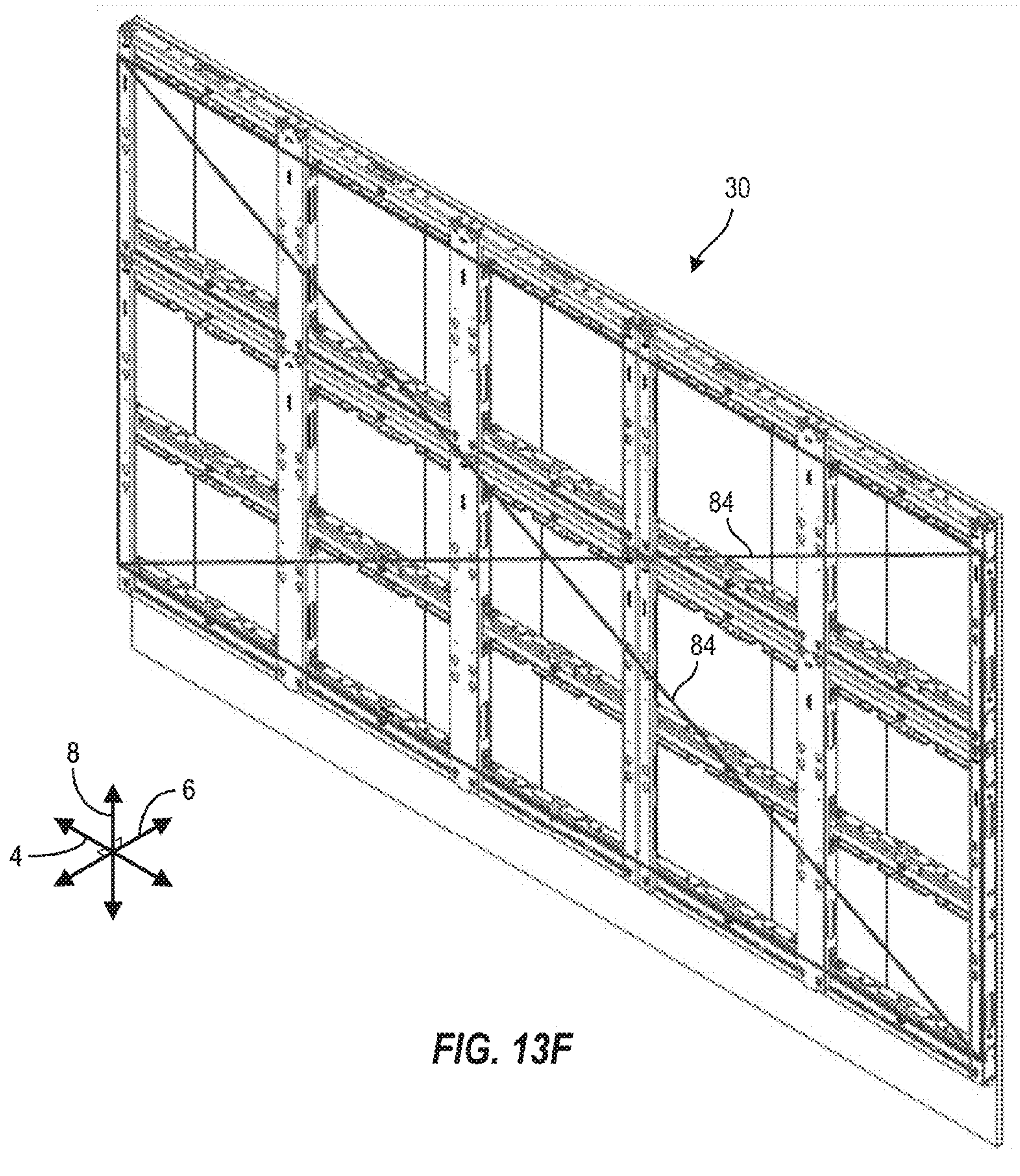

Once all the frames 32 of the support substructure 30 are installed and aligned (e.g., installed and z-adjusted), then the method can include plumbing and leveling the entire substructure 30. This can include securing strings 84 proximate to the corners of the substructure 30 in an x-shaped pattern, as shown in FIG. 13F. Then, the frames 32 of the substructure 30 can be z-adjusted using the z-adjustment mechanisms so that the front faces of all of the frames 32 are level and plumb with respect to the strings 84 and so that the front faces of all the frames 32 are plumb and level with respect to each other.

Figure 13G:
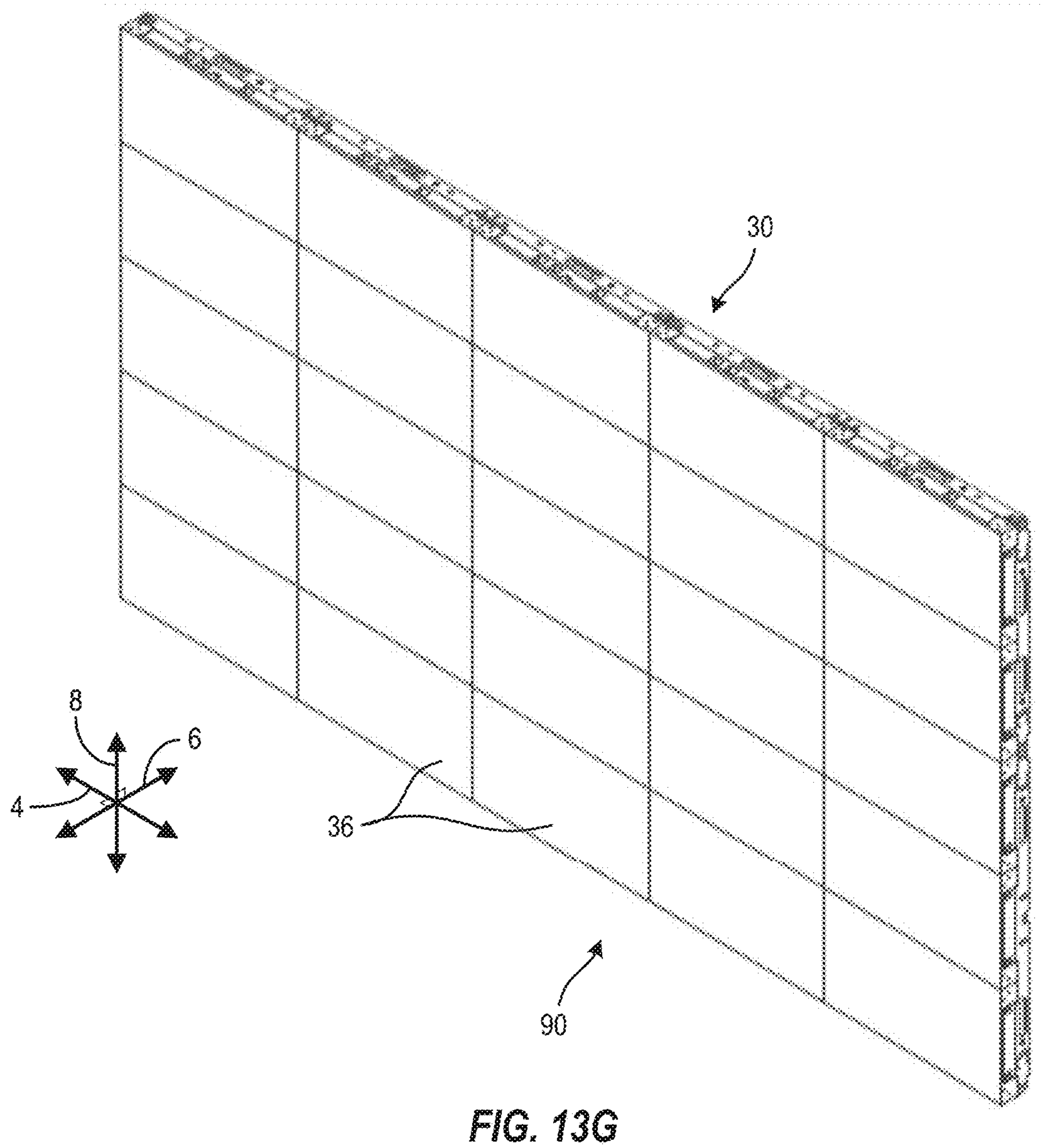

Once the entire substructure 30 is plumb and level, the method can include mounting the display modules 36 to the front faces of the frames 32 to form an overall electronic display 90, as shown in FIG. 13G. Mounting the display modules 36 to the substructure 30 can include aligning and leveling each display module 36 (e.g., using levels) and/or mounting the display modules 36 one at a time until the entire electronic display 90 is formed. Those having skill in the art will appreciate that mounting and aligning the display modules 36 of the electronic display 90 can be performed by many methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A support system for an electronic display, the support system comprising:

a plurality of support frames configured to be adjustably mounted directly to a planar or substantially planar building structure, wherein each support frame comprises a frame mounting face configured to be mounted directly to the planar or substantially planer building structure and a module mounting face configured for mounting one or more display modules directly thereto; and at least one adjustment mechanism corresponding to each of the one or more support frames, wherein each adjustment mechanism is operable to adjust positioning or alignment, or both positioning and alignment, of the corresponding support frame relative to the planar or substantially planar building structure, thereby providing a substantially planar display mounting face comprising the module mounting faces of the plurality of support frames, wherein the substantially planar display mounting face is configured for attaching a plurality of the display modules directly to the plurality of support frames and form an overall electronic display face formed from the display modules mounted directly to the display mounting face.

2. The support system of claim 1, wherein the plurality of support frames comprises a first support frame sized to support a first number of the display modules and a second support frame sized to support a second number of the display modules that is greater than the first number of display modules.

3. The support system of claim 1, wherein the at least one adjustment mechanism comprises a first translation mechanism that is operable to translate the corresponding support frame in a first translation direction relative to the planar or substantially planar building structure.

4. The support system of claim 3, wherein the at least one adjustment mechanism further comprises a second translation mechanism that is operable independent from the first translation mechanism to translate the corresponding support frame in a second translation direction relative to the planar or substantially planar building structure, wherein the second translation direction is different from the first translation direction.

5. The support system of claim 3, wherein each corresponding support frame comprises a track and the first adjustment mechanism comprises a main body that is slidable along the track, wherein either the corresponding support frame or the main body are configured to be coupled directly to the planar or substantially planar building structure.

6. The support system of claim 1, wherein the at least one adjustment mechanism comprises an alignment mechanism that is operable to adjust an alignment of the corresponding support frame relative to the planar or substantially planar building structure.

7. The support system of claim 6, wherein the alignment mechanism comprises an adjustment bolt that is movably coupled to the corresponding support frame, wherein movement of the adjustment bolt is configured to move a portion of the corresponding support frame toward or away from the planar or substantially planar building structure.

8. The support system of claim 1, wherein each support frame comprises one or more alignment structures configured to assist an installer in positioning the support frame relative to an adjacent support frame.

9. The support system of claim 8, wherein the one or more alignment structures comprises one or more first alignment structures configured to assist with alignment in a first direction and one or more second alignment structures configured to assist with alignment in a second direction, wherein the second direction is different from the first direction.

10. An electronic display comprising:

a support system comprising:

a plurality of support frames configured to be adjustably mounted directly to a planar or substantially planar building structure, wherein each support frame comprises a frame mounting face configured to be mounted to the planar or substantially planar building structure and a module mounting face configured for mounting one or more display modules directly thereto; and at least one adjustment mechanism corresponding to each of the one or more support frames, wherein each adjustment mechanism is operable to adjust positioning or alignment, or both positioning and alignment, of the corresponding support frame relative to the planar or substantially planar building structure;

wherein the adjustment mechanisms of the plurality of support frames are configured to adjust one or both of positioning and alignment of the plurality of support frames so that the frame mounting faces of the plurality of support frames are aligned to collectively form a display mounting face comprising the module mounting faces of the plurality of support frames; and a plurality of display modules directly mounted to the display mounting face, wherein each module comprises a module display face comprising an array of light-emitting element pixels, wherein the plurality of display modules mounted directly to the display mounting face form an overall display surface comprising the module display faces of the plurality of display modules.

11. The electronic display of claim 10, wherein the at least one adjustment mechanism comprises at least one translation adjustment mechanism operable to translate the corresponding support frame in one or more translation directions relative to the planar or substantially planar building structure.

12. The electronic display of claim 11, wherein each corresponding support frame comprises a track, and wherein the translation adjustment mechanism comprises a main body that is slidable along the track, wherein either the corresponding support frame or the main body are configured to be coupled directly to the planar or substantially planar building structure.

13. The electronic display of claim 10, wherein the at least one adjustment mechanism comprises an alignment mechanism that is operable to adjust an alignment of the corresponding support frame relative to the planar or substantially planar building structure.

14. The electronic display of claim 13, wherein the alignment mechanism comprises an adjustment bolt that is movably coupled to the corresponding support frame, wherein movement of the adjustment bolt is configured to move a portion of the corresponding support frame toward or away from the planar or substantially planar building structure.

15. The electronic display of claim 10, wherein each support frame comprises one or more alignment structures configured to assist an installer in positioning the support frame relative to an adjacent support frame.

16. The electronic display of claim 15, wherein the one or more alignment structures comprises one or more first alignment structures configured to assist with alignment in a first alignment direction and one or more second alignment structures configured to assist with alignment in a second alignment direction, wherein the second alignment direction is different from the first alignment direction.

17. The support system of claim 3, wherein the planar or substantially planar building structure comprises a planar or substantially planar structure face, wherein the first translation direction is parallel or substantially parallel to the planar or substantially planar structure face.

18. The support system of claim 4, wherein the planar or substantially planar building structure comprises a planar or substantially planar structure face, wherein the first and second translation directions are parallel or substantially parallel to the planar or substantially planar structure face.

19. The support system of claim 9, wherein the planar or substantially planar building structure comprises a planar or substantially planar structure face, wherein the first and second alignment directions are parallel or substantially parallel to the planar or substantially planar structure face.

20. The electronic display of claim 11, wherein the planar or substantially planar building structure comprises a planar or substantially planar structure face, and wherein each of the one or more translation directions is parallel or substantially parallel to the planar or substantially planar structure face.

21. The electronic display of claim 16, wherein the planar or substantially planar building structure comprises a planar or substantially planar structure face, wherein the first and second alignment directions are parallel or substantially parallel to the planar or substantially planar structure face.

* * * * *